US012690233B2

(12) United States Patent
Doornbos et al.

(10) Patent No.: US 12,690,233 B2
(45) Date of Patent: Jul. 21, 2026

(54) RAISED SOURCE/DRAIN OXIDE SEMICONDUCTING THIN FILM TRANSISTOR AND METHODS OF MAKING THE SAME

(71) Applicant: Taiwan Semiconductor Manufacturing Company Limited, Hsinchu (TW)

(72) Inventors: Gerben Doornbos, Kessel-Lo (BE); Blandine Duriez, Brussels (BE); Marcus Johannes Henricus van Dal, Linden (BE)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 38 days.

(21) Appl. No.: 17/215,997

(22) Filed: Mar. 29, 2021

(65) Prior Publication Data
US 2021/0376156 A1     Dec. 2, 2021

Related U.S. Application Data

(60) Provisional application No. 63/031,736, filed on May 29, 2020.

(51) Int. Cl.
*H01L 29/786*     (2006.01)
*H10D 30/67*     (2025.01)
(Continued)

(52) U.S. Cl.
CPC ..... *H10D 30/6713* (2025.01); *H10D 30/6755* (2025.01); *H10D 99/00* (2025.01); (Continued)

(58) Field of Classification Search
CPC ........... H10D 30/6713; H10D 30/6755; H10D 99/00; H10D 62/82; H10D 62/8271; (Continued)

(56) References Cited

U.S. PATENT DOCUMENTS

| | | | |
|---|---|---|---|
| 7,211,825 B2 * | 5/2007 | Shih | .................. H10D 30/6734 257/66 |
| 7,923,722 B2 * | 4/2011 | Ryu | .................. H01L 21/02565 257/43 |

(Continued)

FOREIGN PATENT DOCUMENTS

| | | |
|---|---|---|
| KR | 10-2012-0122912 | 11/2012 |
| KR | 10-2014-0010100 A | 1/2014 |

(Continued)

OTHER PUBLICATIONS

Ahmed Kiani, "Analysis of metal oxide thin film transistors with high-k dielectrics and source/drain contact metals," PhD Dissertation at University of Cambridge (2013).*

(Continued)

*Primary Examiner* — Jay C Kim
(74) *Attorney, Agent, or Firm* — The Marbury Law Group, PLLC

(57)     ABSTRACT
A transistor, integrated semiconductor device and methods of making. The transistor includes a patterned gate electrode, a dielectric layer located over the patterned gate electrode and a patterned first oxide semiconductor layer comprising a channel region and source/drain regions located on sides of the channel region. The thickness of the source/drain regions is greater than a thickness of the channel region. The transistor also includes contacts located on the patterned first oxide semiconductor layer and connected to the source/drain regions of the patterned first oxide semiconductor layer.

22 Claims, 35 Drawing Sheets

(51) Int. Cl.

| | |
|---|---|
| *H10D 99/00* | (2025.01) |
| *H10B 61/00* | (2023.01) |
| *H10B 63/00* | (2023.01) |
| *H10D 62/82* | (2025.01) |
| *H10P 14/20* | (2026.01) |
| *H10P 14/24* | (2026.01) |

(52) U.S. Cl.
CPC .............. *H10B 61/22* (2023.02); *H10B 63/30* (2023.02); *H10D 62/82* (2025.01); *H10P 14/24* (2026.01); *H10P 14/3426* (2026.01); *H10P 14/3434* (2026.01)

(58) Field of Classification Search
CPC ......... H10B 61/22; H10B 63/30; H10P 14/24; H10P 14/3426; H10P 14/3434; H01L 21/02554; H01L 21/02565; H01L 29/267; H01L 29/66969; H01L 29/78618; H01L 29/7869; H01L 21/0262
See application file for complete search history.

(56) References Cited

U.S. PATENT DOCUMENTS

| | | | | |
|---|---|---|---|---|
| 8,063,421 | B2 * | 11/2011 | Kang ................. | H10D 30/6755 257/59 |
| 8,148,779 | B2 * | 4/2012 | Jeong ................. | H01L 29/7869 257/59 |
| 8,193,045 | B2 * | 6/2012 | Omura ............... | H10D 30/6713 438/149 |
| 8,269,220 | B2 * | 9/2012 | Ryu ........................ | H10D 30/67 257/385 |
| 8,492,757 | B2 * | 7/2013 | Sakata .............. | H01L 29/78606 257/66 |
| 8,569,754 | B2 * | 10/2013 | Yamazaki .............. | H10D 64/62 257/E29.296 |
| 8,581,245 | B2 * | 11/2013 | Taniguchi ........... | H01L 29/7869 257/E21.409 |
| 8,634,230 | B2 * | 1/2014 | Uochi ............... | H01L 29/40114 365/150 |
| 8,766,250 | B2 * | 7/2014 | Miyanaga ........... | H01L 29/7869 438/85 |
| 8,952,381 | B2 * | 2/2015 | Yamazaki ............... | H01L 29/24 438/85 |
| 9,419,029 | B1 * | 8/2016 | Dai ....................... | H10D 30/022 |
| 9,761,732 | B2 * | 9/2017 | Nomura ............ | H01L 29/66969 |
| 9,812,581 | B2 * | 11/2017 | Kitakado .......... | H10D 30/6713 |
| 9,954,003 | B2 * | 4/2018 | Matsuda ........... | H01L 29/78648 |
| 9,991,396 | B2 * | 6/2018 | Sakata .............. | H01L 29/42384 |
| 10,121,903 | B2 * | 11/2018 | Yamazaki ........... | H01L 29/7869 |
| 10,217,851 | B2 * | 2/2019 | Niu ..................... | H10D 30/6755 |
| 10,269,835 | B2 * | 4/2019 | Yamazaki ......... | H01L 29/78618 |
| 11,302,717 | B2 * | 4/2022 | Yamazaki ........... | H01L 27/1229 |
| 11,387,366 | B2 * | 7/2022 | Sharma ............. | H10D 30/0321 |
| 11,417,773 | B2 * | 8/2022 | Yamazaki ......... | H01L 29/66742 |
| 11,437,405 | B2 * | 9/2022 | Dewey ................ | H10D 86/423 |
| 12,148,828 | B2 * | 11/2024 | Vellianitis ........... | H10D 30/701 |
| 2005/0270259 | A1 * | 12/2005 | Shirasaki ........... | H10K 59/1315 345/76 |
| 2010/0051938 | A1 | 3/2010 | Hayashi et al. | |
| 2010/0295038 | A1 | 11/2010 | Tada et al. | |
| 2011/0180793 | A1 | 7/2011 | Taniguchi | |
| 2016/0013325 | A1 * | 1/2016 | Kitakado ........... | H10D 30/6713 257/43 |
| 2016/0204269 | A1 | 7/2016 | Sakata et al. | |
| 2018/0323264 | A1 | 11/2018 | Le et al. | |
| 2020/0091274 | A1 * | 3/2020 | Sharma .............. | H01L 29/4908 |

FOREIGN PATENT DOCUMENTS

| | | | | |
|---|---|---|---|---|
| KR | 2018-0129800 | A | 12/2018 | |
| TW | 201308606 | A | 2/2013 | |
| TW | 201833062 | A | 9/2018 | |
| TW | 201944491 | A | 11/2019 | |
| WO | WO-2019-066824 | A1 * | 4/2019 | ........... H01L 29/786 |

OTHER PUBLICATIONS

Office Action received from the German (Federal Republic of Germany) Patent Office in related Application No. 102021108615.9, issued Feb. 20, 2023; 8 pages.

Office Action received from the Korean Patent Office in related Application No. 10-2021-0068426 filed May 27, 2021 issued Jan. 28, 2023.

Second Office Action received from the Korean Patent and Trademark Office in related KR Application No. 10-2021-0068426, mailed Jul. 24, 2023, 6 pages.

Chinese Patent and Trademark Office in related CN Application No. 202110601485.X, Publication No. CN113380897A, mailed Nov. 30, 2023, 11 pages.

Office Action received from the Taiwanese Patent Office in related TW Application No. 110118883 mailed Jun. 19, 2023, 8 pages.

Third Office Action, Patent Rejection decision, received from the Korean Patent and Trademark Office in related KR Application No. 10-2021-0068426, mailed Nov. 17, 2023, 6 pages.

Chinese Patent and Trademark Office in related CN Application No. 202110601485.X, second Office Action mailed Jun. 29, 2024; 22 pages.

* cited by examiner

700

702 — depositing at least one oxide semiconductor layer over a substrate or interlayer dielectric 704 — etching a central portion of the at least one oxide semiconductor layer to form a channel region and source/drain regions on the either side of the channel region, wherein the channel region is thinner than source/drain regions

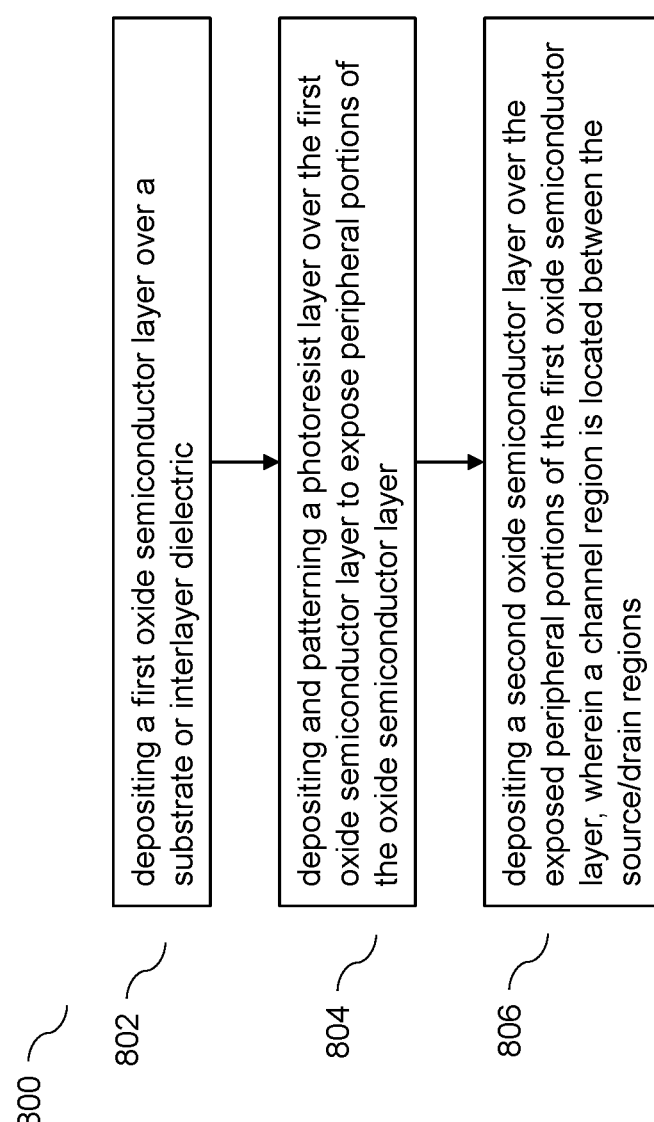

800

802 — depositing a first oxide semiconductor layer over a substrate or interlayer dielectric 804 — depositing and patterning a photoresist layer over the first oxide semiconductor layer to expose peripheral portions of the oxide semiconductor layer 806 — depositing a second oxide semiconductor layer over the exposed peripheral portions of the first oxide semiconductor layer, wherein a channel region is located between the source/drain regions

FIG. 26

RAISED SOURCE/DRAIN OXIDE SEMICONDUCTING THIN FILM TRANSISTOR AND METHODS OF MAKING THE SAME

RELATED APPLICATIONS

This application claims priority to U.S. Provisional Patent Application No. 63/031,736 entitled "Raised Source/Drain Oxide Semiconducting Thin Film Transistor" filed on May 29, 2020, the entire contents of which are hereby incorporated by reference for all purposes.

BACKGROUND

In the semiconductor industry, there is constant desire to increase the areal density of integrated circuits. To do so, individual transistors have become increasingly smaller. However, the rate at which individual transistors may be made smaller is slowing. Moving peripheral transistors from the front-end-of-line (FEOL) to the back-end-of Line (BEOL) of fabrication may be advantageous because functionality may be added at the BEOL while valuable chip area may be made available in the FEOL. Thin film transistors (TFT) made of oxide semiconductors are an attractive option for BEOL integration since TFTs may be processed at low temperatures and thus, will not damage previously fabricated devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 26 is a flowchart that illustrates general processing steps of alterative embodiment methods of the present disclosure.

DETAILED DESCRIPTION

Figures 1A, 1B:
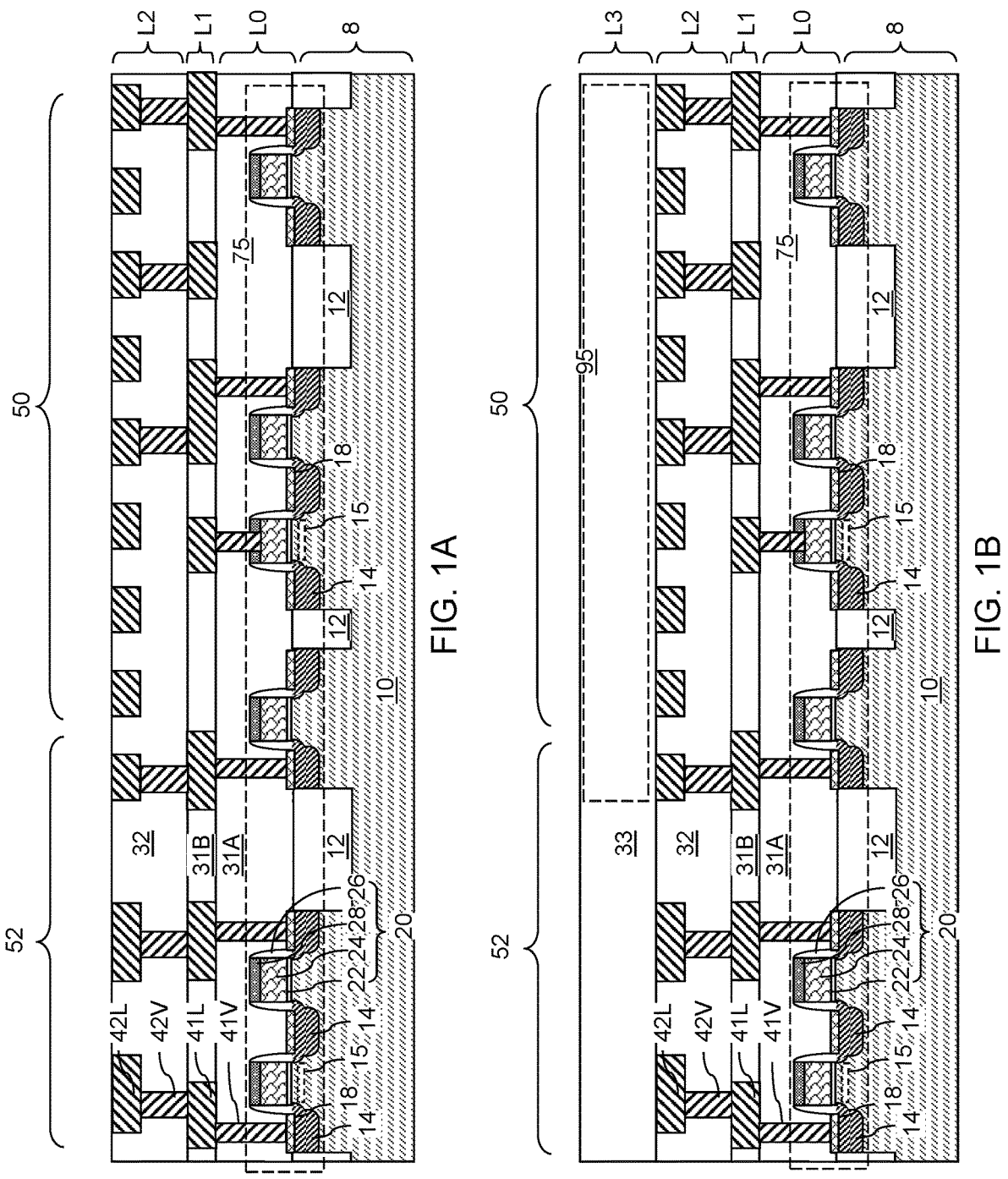
FIG. 1A is a vertical cross-sectional view of an exemplary structure after formation of complementary metal-oxide-semiconductor (CMOS) transistors, metal interconnect structures embedded in dielectric material layers, and a connection-via-level dielectric material layer according to an embodiment of the present disclosure.
FIG. 1B is a vertical cross-sectional view of the first exemplary structure during formation of the array of thin film transistors according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor transistors, and specifically to raised source/drain oxide semiconducting thin film transistors and methods of forming the same. Embodiments also include integrated circuits having raised source/drain oxide thin film transistors, especially raised source/drain oxide thin film transistors formed in the BEOL.

While their performance (switching speed) is typically insufficient to perform core logic functions, thin film transistors (TFT) have the potential to execute many non-core logic tasks, such a power gating, memory selection, or interfacing (input/output, I/O). Since TFTs can be processed at low temperature, they can be integrated in the BEOL. Moving peripheral devices (power gates, memory selectors, I/O transistors) from the FEOL to the BEOL (essentially stacking them on top of the FEOL) may be done as part of a scaling path for instance for the 3 nm technology node fabrication; moving peripheral devices out of the FEOL and stacking them may result in about 5-10% density improvement for a given device.

Peripheral transistors which may be moved from the FEOL to the BEOL include, but are not limited to, power gates, input/output transistors and memory selectors. In current technology, power gates are large logic transistors which are located in the FEOL. Power gates may be used to switch off logic blocks in standby, thereby reduce static power consumption. I/O devices are the interface between a computing element (e.g., a CPU) and the outside world (e.g., an external memory) and are also processed in the FEOL. The selector for a memory element, such as a magnetoresistive random-access memory (MRAM) or a resistive random-access memory (RRAM) is presently located in the FEOL and may be moved to the BEOL. Typically, there is one selector TFT for each memory element.

Oxide semiconductors are being developed for use as a channel material for TFTs. Oxide materials have been discovered that become semiconducting when thin, e.g. less than 8 nm, but are semimetals when thicker, e.g. 15-150 nm. However, the contact resistance between a metal and the thin film oxide semiconductor is high when the semiconducting oxide layer is thin. Often the current flowing through such thin-film transistors is fully dominated by parasitic resistance, which is undesirable. It has proven difficult to fabricate good electrical contacts to very thin oxide layers. Further, poor contacts tend to dominate thin film transistor performance. However, contacts with low contact resistance may be reliably fabricated to thick oxide layers, e.g. 15-150 nm.

The various embodiments disclosed herein utilize a transistor structure that combines the metallic properties of a thick Indium-Tin-Oxide (ITO) layer and semiconducting properties of a thin ITO layer to form a thin-film transistor with low parasitic resistance. Various embodiments may apply other oxides, such as Indium-Gallium-Zinc-Oxide (IGZO), which suffer the same tradeoff between channel modulation (requiring a thin layer) and low parasitic resistance (requiring a thick layer). The various embodiments provide for the optimization of a channel independent of any source/drain design or engineering. Further, the various embodiments do not require doping to form active regions as the material thickness may define the electrical characteristics of different structures. Further, the various embodiments provide for a scalable thin film transistor architecture.

FIG. 1A is a vertical cross-sectional view of an exemplary structure after formation of complementary metal-oxide-semiconductor (CMOS) transistors, metal interconnect structures embedded in dielectric material layers, and a connection-via-level dielectric material layer prior to formation of an array of memory structures, according to various embodiments of the present disclosure. Referring to FIG. 1A, an exemplary structure according to an embodiment of the present disclosure is illustrated. The exemplary structure includes complementary metal-oxide-semiconductor (CMOS) transistors and metal interconnect structures formed in dielectric material layers. Specifically, the first exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). Shallow trench isolation structures 12 including a dielectric material such as silicon oxide may be formed in an upper portion of the substrate 8. Suitable doped semiconductor wells, such as p-type wells and n-type wells, may be formed within each area that may be laterally enclosed by a portion of the shallow trench isolation structures 12. Field effect transistors may be formed over the top surface of the substrate 8 in a front end of line (FEOL). For example, each field effect transistor may include active source/drain regions 14, a semiconductor channel 15 that includes a surface portion of the substrate 8 extending between the active source/drain regions 14, and a gate structure 20. Each gate structure 20 may include a gate dielectric 22, a gate electrode 24, a gate cap dielectric 28, and a dielectric gate spacer 26. An active source/drain metal-semiconductor alloy region 18 may be formed on each active source/drain region 14. While planar field effect transistors are illustrated in the drawings, embodiments are expressly contemplated herein in which the field effect transistors may additionally or alternatively include fin field effect transistors (FinFET), gate-all-around field effect (GAA FET) transistors, or any other type of field effect transistors (FETs).

The exemplary structure may include a memory array region 50 in which an array of memory elements may be subsequently formed, and a peripheral region 52 in which logic devices that support operation of the array of memory elements may be formed. In one embodiment, devices (such as field effect transistors) in the memory array region 50 may include bottom electrode access transistors that provide access to bottom electrodes of memory cells to be subsequently formed. Top electrode access transistors that provide access to top electrodes of memory cells to be subsequently formed may be formed in the peripheral region 52 at this processing step.

Devices (such as field effect transistors) in the peripheral region 52 may provide functions that may be needed to operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a top electrode bias circuitry. The devices formed on the top surface of the substrate 8 may include complementary metal-oxide-semiconductor (CMOS) transistors and optionally additional semiconductor devices (such as resistors, diodes, capacitors, etc.), and are collectively referred to as CMOS circuitry 75.

Various interconnect-level structures may be subsequently formed, which are formed prior to formation of an array of thin film transistors and are herein referred to as lower interconnect-level structures (L0, L1, L2). In case a two-dimensional array of TFTs is to be subsequently formed over two levels of interconnect-level metal lines, the lower interconnect-level structures (L0, L1, L2) may include an interconnect-level structure L0, a first interconnect-level structure L1, and a second interconnect-level structure L2. The dielectric material layers may include, for example, a contact-level dielectric material layer 31A, a first metal-line-level dielectric material layer 31B, and a second line-and-via-level dielectric material layer 32. Various metal interconnect structures embedded in dielectric material layers may be subsequently formed over the substrate 8 and the devices (such as field effect transistors). The metal interconnect structures may include device contact via structures 41V formed in the contact-level dielectric material layer 31A (interconnect-level structure L0) and contact a respective component of the CMOS circuitry 75, first metal line structures 41L formed in the first metal-line-level dielectric material layer 31B (interconnect-level structure L1), first metal via structures 42V formed in a lower portion of the second line-and-via-level dielectric material layer 32, second metal line structures 42L formed in an upper portion of the second line-and-via-level dielectric material layer 32 (interconnect-level structure L2).

Each of the dielectric material layers (31A, 31B, and 32) may include a dielectric material such as an undoped silicate glass, a doped silicate glass, organosilicate glass, amorphous fluorinated carbon, porous variants thereof, or combinations thereof. Each of the metal interconnect structures (41V, 41L, 42V, and 42L) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first metal via structures 42V and the second metal line structures 42L may be formed as integrated line and via structures by a dual damascene process, and the second metal via structures 43V and the third metal line structures 43L may be formed as integrated line and via structures.

The dielectric material layers (31A, 31B, and 32) may be located at a lower level relative to an array of memory cells to be subsequently formed. As such, the dielectric material layers (31A, 31B, and 32) are herein referred to as lower-level dielectric material layers, i.e., dielectric material layer located at a lower level relative to the array of memory cells to be subsequently formed. The metal interconnect structures (41V, 41L, 42V, and 42L) are herein referred to lower-level metal interconnect structures. A subset of the metal interconnect structures (41V, 41L, 42V, and 42L) includes lower-level metal lines (such as the third metal line structures 42L) that are embedded in the lower-level dielectric material layers and having top surfaces within a horizontal plane including a topmost surface of the lower-level dielectric material layers. Generally, the total number of metal line levels within the lower-level dielectric material layers (31A, 31B, and 32) may be in a range from 1 to 3.

The exemplary structure may include various devices regions, which may include a memory array region 50 in which at least one array of non-volatile memory cells may be subsequently formed. For example, the at least one array of non-volatile memory cells may include resistive random-access memory (RRAM or ReRAM), magnetic/magneto-resistive random-access memory (MRAM), ferroelectric random-access memory (FeRAM), and phase-change memory (PCM) devices. The exemplary structure may also include a peripheral logic region 52 in which electrical connections between each array of non-volatile memory cells and a peripheral circuit including field effect transistors may be subsequently formed. Areas of the memory array region 50 and the logic region 52 may be employed to form various elements of the peripheral circuit.

Referring to FIG. 1B, an array 95 of non-volatile memory cells and TFTs may be formed in the memory array region 50 over the second interconnect-level structure L2. The details for the structure and the processing steps for the array 95 of the TFTs are described in detail below. A third interconnect level dielectric material layer 33 may be formed during formation of the array 95 of non-volatile gated ferroelectric memory cells. The set of all structures formed at the level of the array 95 of non-volatile memory cells and TFTs is herein referred to as a third interconnect-level structure L3. The devices formed within array 95 at a BEOL may be coupled through the various interconnect-level metal interconnect structures to FEOL devices formed on the substrate 8 or to subsequently formed devices in upper layers through upper interconnect-level structures.

Figure 1C:
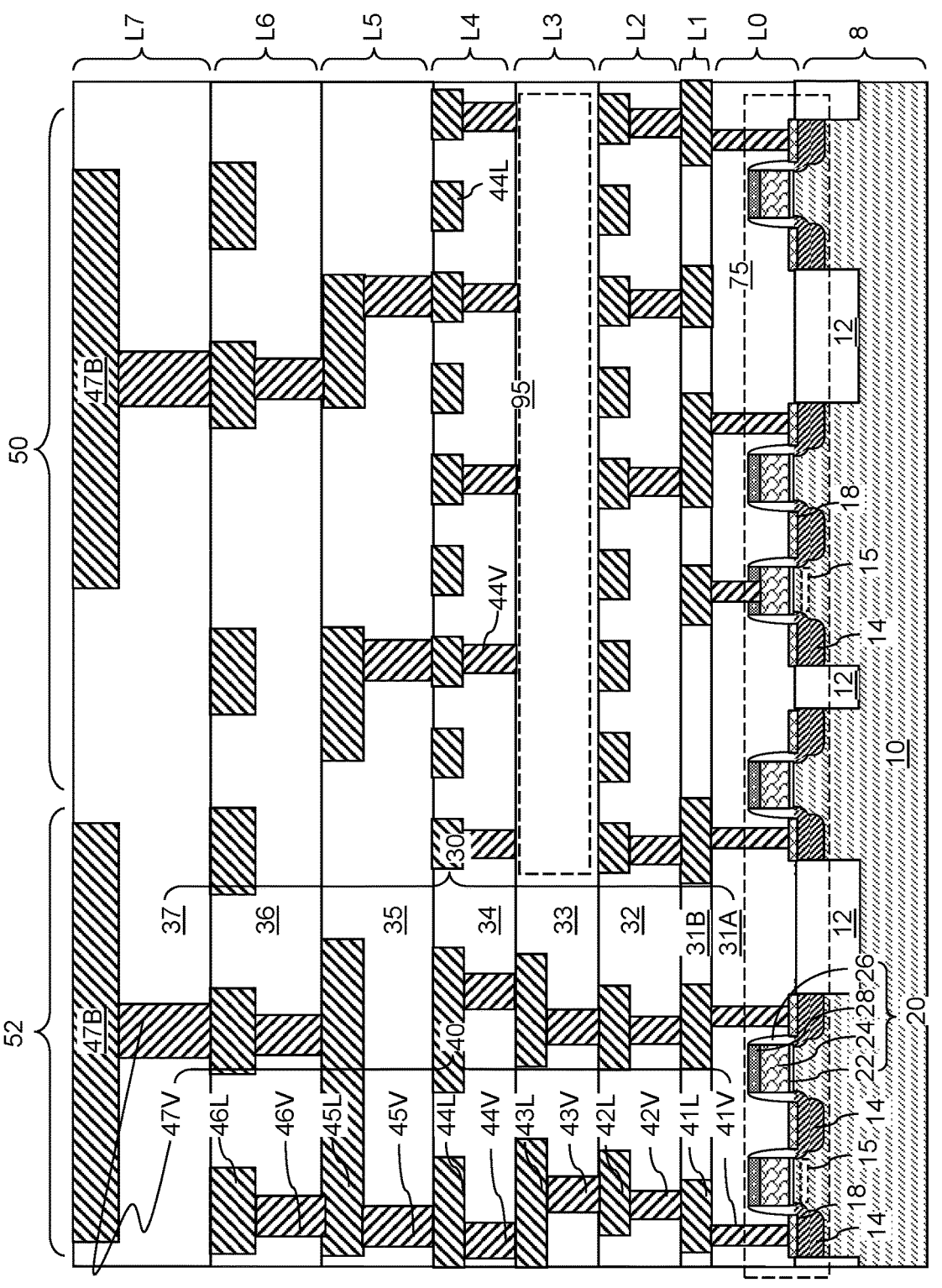
FIG. 1C is a vertical cross-sectional view of the first exemplary structure after formation of upper-level metal interconnect structures according to an embodiment of the present disclosure.

Referring to FIG. 1C, third interconnect-level metal interconnect structures (43V, 43L) may be formed in the third interconnect level dielectric material layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth interconnect level dielectric material layer 34 having formed therein fourth interconnect-level metal interconnect structures (44V, 44L), which may include third metal via structures 44V and fourth metal lines 44L. The fifth interconnect-level structure L5 may include a fifth interconnect level dielectric material layer 35 having formed therein fifth interconnect-level metal interconnect structures (45V, 45L), which may include fourth metal via structures 45V and fifth metal lines 45L. The sixth interconnect-level structure L6 may include a sixth interconnect level dielectric material layer 36 having formed therein sixth interconnect-level metal interconnect structures (46V, 46L), which may include fifth metal via structures 46V and sixth metal lines 46L. The seventh interconnect-level structure L7 may include a seventh interconnect level dielectric material layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding), or may be configured for metal-to-metal bonding (such as copper-to-copper bonding).

Each interconnect level dielectric material layer may be referred to as an interconnect level dielectric material layer (ILD) layer 30 (i.e., 31A, 31B, 32, 33, 34, 35, 36, and 37). Each interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by employing two single damascene processes, or may be simultaneously formed as a unitary structure employing a dual damascene process. Each of the metal interconnect structure 40 (i.e., 41V, 41L, 42V, 42L, 43V, 43L, 44V, 44L, 45V, 45L, 46V, 46L, 47V, 47B) may include a respective metallic liner (such as a layer of TiN, TaN, or WN having a thickness in a range from 2 nm to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric material layers and dielectric capping layers may be inserted between vertically neighboring pairs of ILD layers 30, or may be incorporated into one or more of the ILD layers 30.

While the present disclosure is described employing an embodiment in which the array 95 of non-volatile memory cells and TFT selector devices may be formed as a component of a third interconnect-level structure L3, embodiments are expressly contemplated herein in which the array 95 of non-volatile memory cells and TFT selector devices may be formed as components of any other interconnect-level structure (e.g., L1-L7). Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 95 of non-volatile memory cells and TFT selector devices may be provided within multiple interconnect-level structures in the memory array region 50. While the present disclosure is described employing an embodiment in which an array 95 of non-volatile memory cells and TFT selector devices may be formed in a single interconnect-level structure, embodiments are expressly contemplated herein in which an array 95 of non-volatile memory cells and TFT devices may be formed over two vertically adjoining interconnect-level structures.

Figure 2:
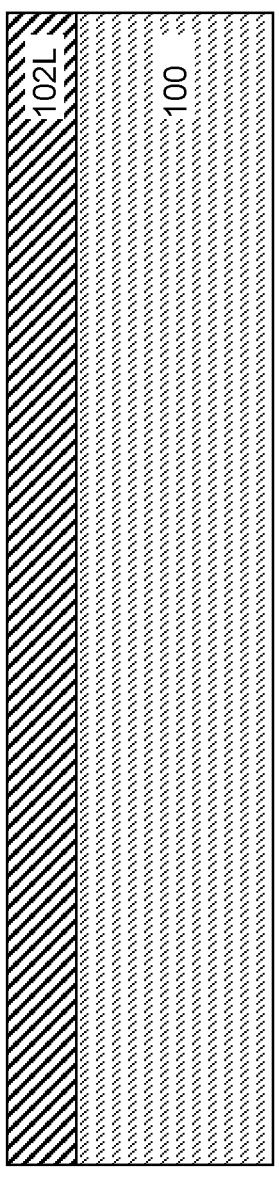
FIG. 2 is a vertical cross sectional view illustrating a step of depositing a continuous metal gate layer on an interconnect level dielectric (ILD) layer in a method of making a transistor according to an embodiment of the present disclosure.

FIGS. 2-24 illustrate various protrusion (or raised source/drain region) TFTs and methods of making the various protrusion TFTs. Referring to FIG. 2, a continuous metal gate layer 102L may be deposited on an ILD 100, such as an ILD layer (i.e., ILD 33) located in the BEOL of an integrated semiconductor device. The ILD layer 100 may be formed from an ILD material such as undoped silicate glass, a doped silicate glass, organosilicate glass, or a porous dielectric material. Other suitable materials for use as the ILD layer 100 are within the contemplated scope of the disclosure. The ILD layer 100 may be formed by any deposition process, such as chemical vapor deposition, spin-coating, physical vapor deposition (PVD) (also referred to as sputtering), atomic layer deposition (ALD), etc. The continuous metal gate layer 102L may be made of metal or metal alloy such as Tungsten (W), Aluminum (Al), Titanium (Ti), Tantalum (Ta), Titanium Aluminum (TiAl), Titanium Nitride (TiN), or Tantalum Nitride (TaN), or multilayers thereof. Other suitable metal materials for the metal gate layer are within the contemplated scope of disclosure. The continuous metal layer 102L may be made by chemical vapor deposition (CVD), plasma enhanced chemical vapor deposition (PECVD), atomic level deposition (ALD) or any other suitable method.

Figure 3A:
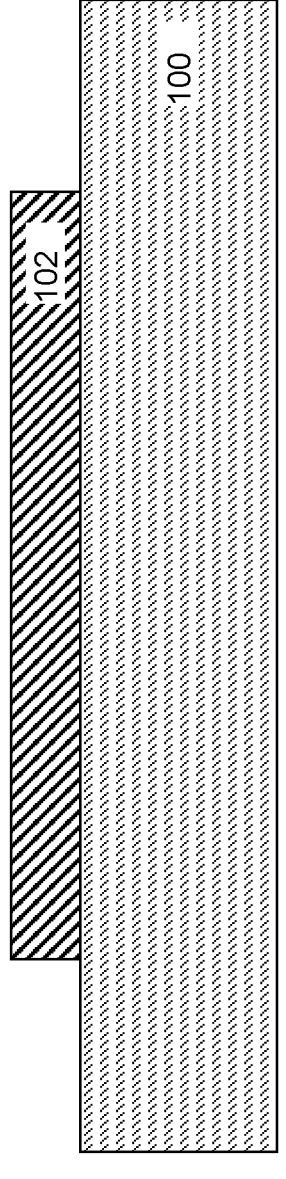
FIG. 3A is a vertical cross sectional view illustrating a step of patterning the continuous metal gate layer to form a gate electrode in a method of making a transistor according to an embodiment of the present disclosure.

Referring to FIG. 3A, the continuous metal gate layer 102L may be patterned to form a patterned gate electrode 102. In various embodiments, a photoresist layer (not shown) may be deposited over the continuous metal gate layer 102L and patterned through a photolithographic process. The patterned photoresist layer may be used as a mask and the underlying continuous metal gate layer 102L may be etched with any suitable etchant. The photoresist layer may be removed by dissolution in a solvent or by ashing.

Figure 3B:
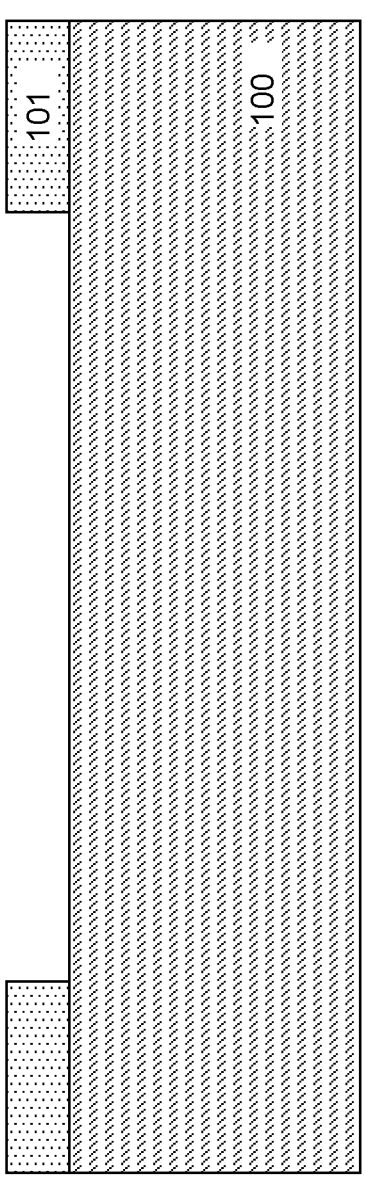
FIG. 3B is a vertical cross sectional view illustrating a step of depositing and patterning a photoresist layer in an alternative method of making a transistor according to an embodiment of the present disclosure.

Referring to FIG. 3B, a step in an alternative embodiment method of forming the patterned method electrode is illustrated. In this method, a photoresist layer 101 is deposited on the surface of an ILD layer 100 and patterned through a photolithographic process. The ILD layer 100 in the alternative embodiment shown in FIGS. 3B and 3C may be thicker than an ILD layer 100 used in an embodiment method shown in FIG. 3A.

Figure 3C:
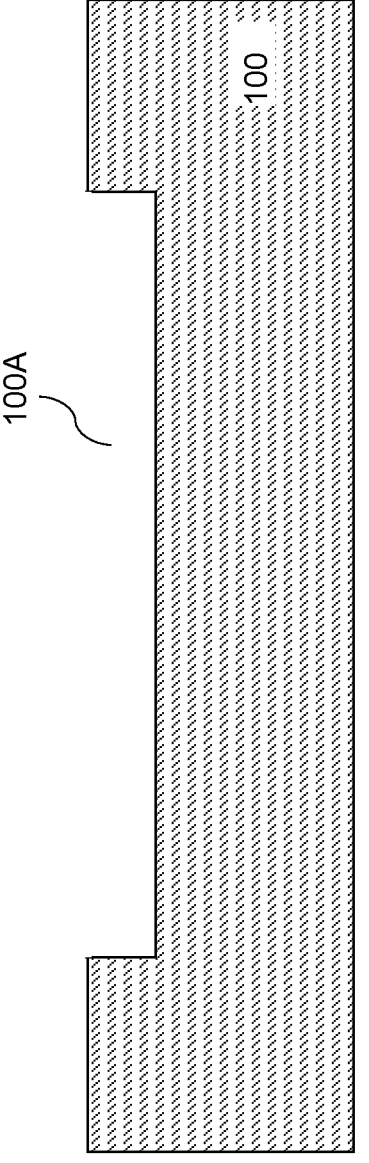
FIG. 3C is a vertical cross sectional view illustrating a step of etching the ILD layer using the patterned photoresist layer as a mask in the alternative method of making a transistor according to an embodiment of the present disclosure.

Referring to FIG. 3C, the ILD layer 100 may be patterned using the photoresist layer 101 as a mask and the underlying ILD layer 100 may be etched with any suitable etchant. The photoresist layer may be removed by dissolution in a solvent or by ashing. The etching of the ILD layer 100 may form a trench 100A in the ILD layer 100, the photoresist layer 101 may be removed. As discussed above, the photoresist layer 101 may be removed by dissolution in a solvent or by ashing.

Figure 4:
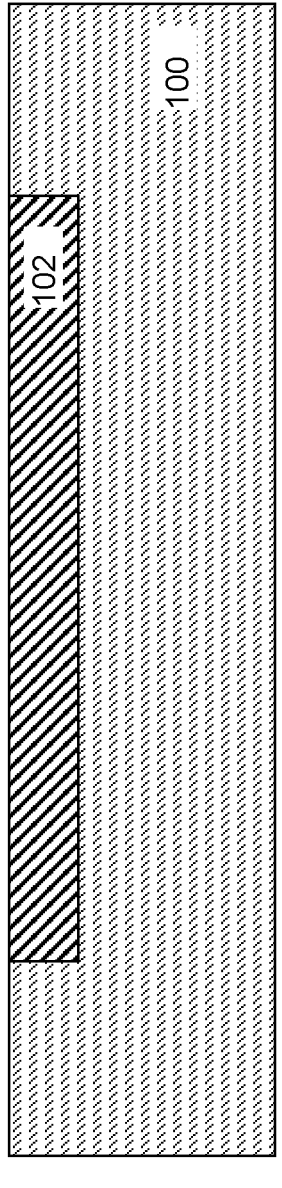
FIG. 4 is a vertical cross sectional view illustrating a step of forming a metal electrode in the etched ILD layer in a method of making a transistor according to an embodiment of the present disclosure.

Referring to FIG. 4, metal may be deposited in the trench 100A in the ILD layer 100. As above, the metal may be deposited by any suitable method, such as CVD, PECVD or ALD. In various embodiment, the surface of the ILD layer 100 and the patterned gate electrode 102 may be planarized, such as by chemical-mechanical polishing (CMP) to remove an excess metal from the deposition process. In the embodiment shown in FIG. 3A, additional dielectric material similar to ILD layer 100 material may be deposited over and around the patterned gate electrode 102. The excess dielectric material may be planarized (e.g., CMP) to remove the excess dielectric material and create a coplanar top surface between the dielectric material and patterned gate electrode 102 as illustrated in FIG. 4.

Figure 5:
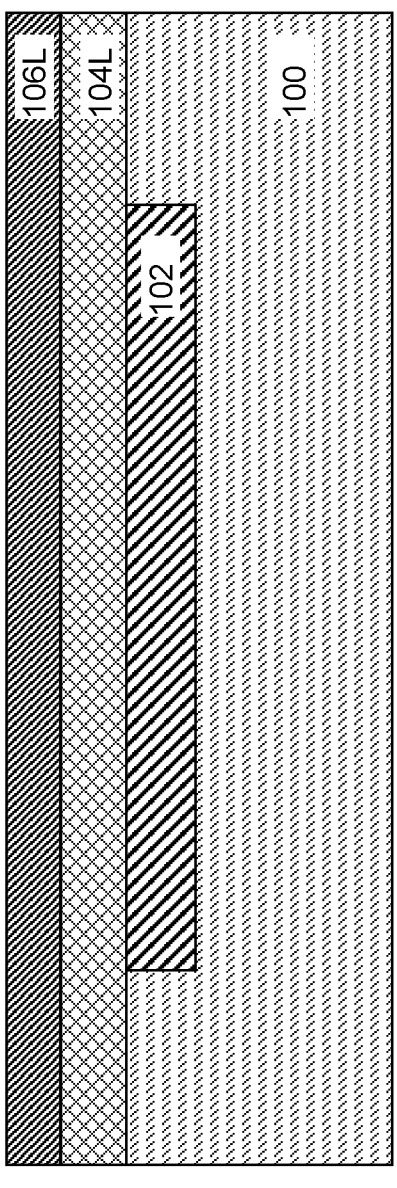
FIG. 5 is a vertical cross sectional view illustrating a step of depositing a continuous high k dielectric layer and a continuous oxide semiconductor layer in a method of making a transistor according to an embodiment of the present disclosure.

Referring to FIG. 5, a continuous high-k dielectric layer 104L may be deposited over the surface of the ILD layer 100 and the patterned gate electrode 102. A continuous first oxide semiconductor layer 106L may be deposited over the continuous high-k dielectric layer 104L. In various embodiments, the high k dielectric material may be any material with a dielectric constant higher than $SiO_2$, (dielectric constant k=3.9). Exemplary high k dielectric materials include $HfO_2$, $Al_2O_3$, $Ta_2O_5$, $ZrO_2$, $TiO_2$, $HfO_2$, HfZrO4 (HZO), $HfSiO_x$, $HfLaO_x$ and any other suitable material. In some embodiments, $SiO_2$ may be used. Further, the continuous high k dielectric layer 104L may be made of multilayers of the above materials. The continuous first oxide semiconductor layer 106L may be made of $In_xGa_yZn_zO_w$ (IGZO), $In_2O_3$, $Ga_2O_3$, ZnO, $In_xSn_yO_z$ (ITO) or any other suitable oxide semiconductor.

In another embodiment, the continuous first oxide semiconductor layer 106L may comprise a laminated structure. In an aspect, the layers of the laminated structure include layers of $In_xGa_yZn_zO$ with different molar percent of In, Ga and Zn. In an embodiment, $0<x\leq0.5$, $0<y\leq0.5$ and $0<z\leq0.5$. In various embodiments, the layers of the laminated structure include layers of other oxides, such as but not limited to, InWO, InZnO, InSnO, $GaO_x$ and $InO_x$.

Figure 6:
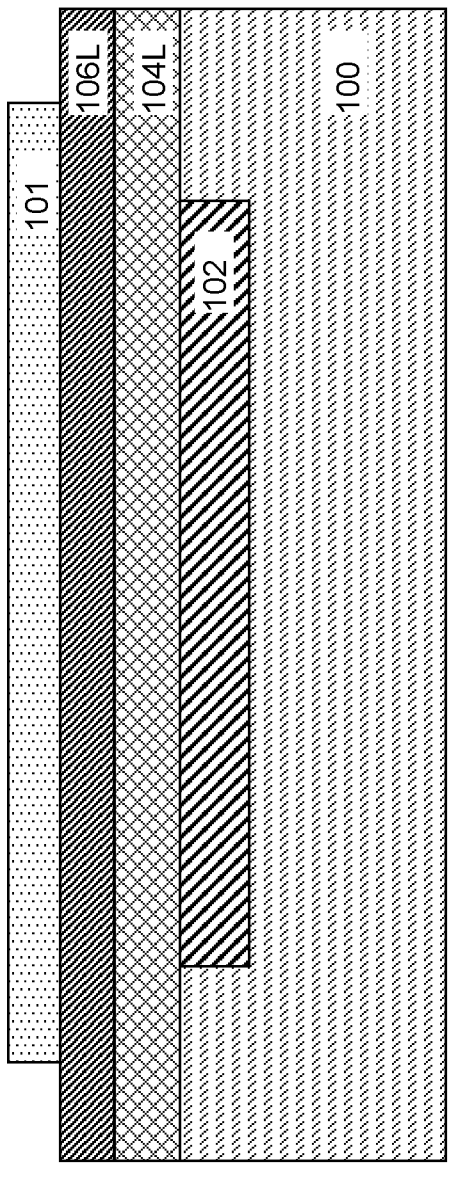
FIG. 6 is a vertical cross sectional view illustrating a step of depositing and patterning a photoresist layer over the continuous high k dielectric layer and the continuous oxide semiconductor layer in a method of making a transistor according to an embodiment of the present disclosure.

Referring FIG. 6, a photoresist layer 101 may be deposited over the surface of the intermediate structure illustrated in FIG. 5. The photoresist layer 101 may then be patterned and used as a mask when etching the underlying continuous first oxide semiconductor layer 106L and the continuous high-k dielectric layer 104L.

Figure 7A:
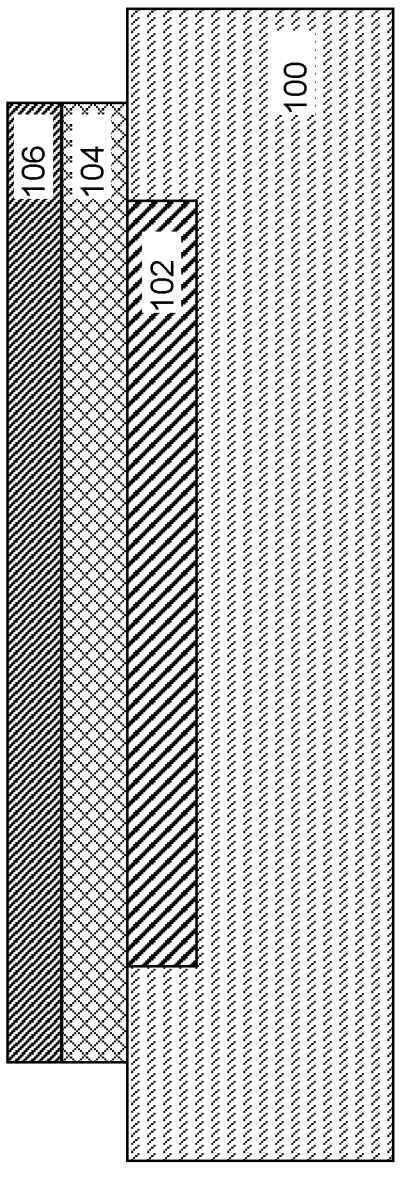
FIG. 7A is a vertical cross sectional view illustrating patterning the continuous high k dielectric layer and the continuous oxide semiconductor layer using the patterned photoresist layer in a method of making a transistor according to an embodiment of the present disclosure.

Referring to FIG. 7A, the patterned photoresist layer (not shown) may be used as a mask to etch the continuous high k dielectric layer 104L and the continuous first oxide semiconductor layer 106L such that a patterned high-k dielectric layer 104 and a patterned first oxide semiconductor layer 106 are formed. In various embodiments, the patterned high-k dielectric layer 104 and the patterned first oxide semiconductor layer 106 may be longer in length than the patterned gate electrode 102 as illustrated in FIG. 7A. However, in alternative embodiments, the patterned high-k dielectric layer 104 and the patterned first oxide semiconductor layer 106 may be the same length as or shorter than the patterned gate electrode 102.

Figure 7B:
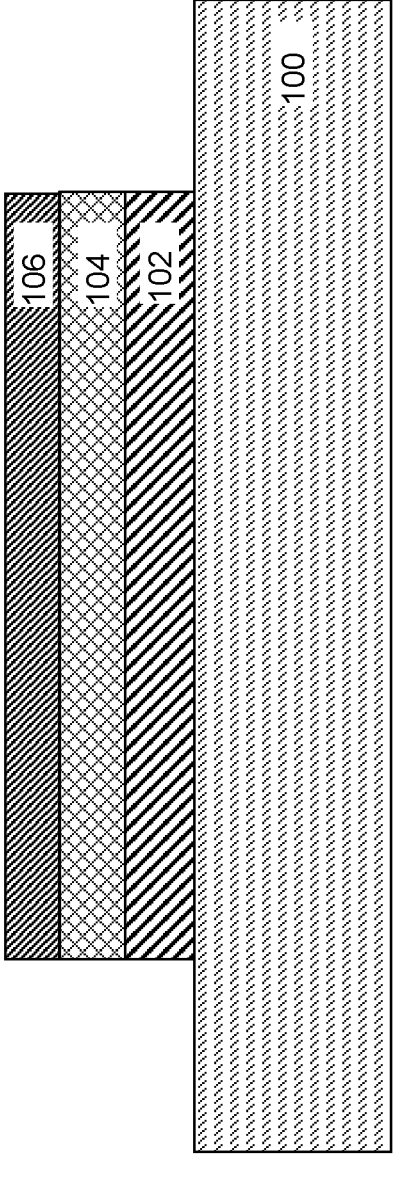
FIG. 7B is a vertical cross sectional view illustrating a step of patterning a continuous metal gate layer, a continuous high k dielectric layer and a continuous oxide semiconductor layer according to an alternative embodiment of the present disclosure.

Referring to FIG. 7B, an embodiment is illustrated in which the patterned high-k dielectric layer 104, the patterned first oxide semiconductor layer 106 and the patterned gate electrode 102 may have the same length. In an aspect, this embodiment may be made by first sequentially depositing a continuous metal gate layer 102L, a continuous high k dielectric layer 104L and a continuous first oxide semiconductor layer 106L. Then, a photoresist layer (not shown) may be deposited over the continuous first oxide semiconductor layer 106L and patterned. The patterned photoresist layer may be used as a mask and the underlying continuous metal gate layer 102L, continuous high-k dielectric layer 104L and continuous first oxide semiconductor layer 106L patterned to form a patterned gate electrode 102, patterned high k dielectric layer 104 and patterned first oxide semiconductor layer 106 all of the same length. The continuous metal gate layer 102L, continuous high k dielectric layer 104L and continuous first oxide semiconductor layer 106L may be etched by wet etching and/or dry etching. Further, the continuous metal gate layer 102L, continuous high-k dielectric layer 104L and continuous first oxide semiconductor layer 106L may be patterned in a single etching step or in a series of etching steps.

Figure 8:
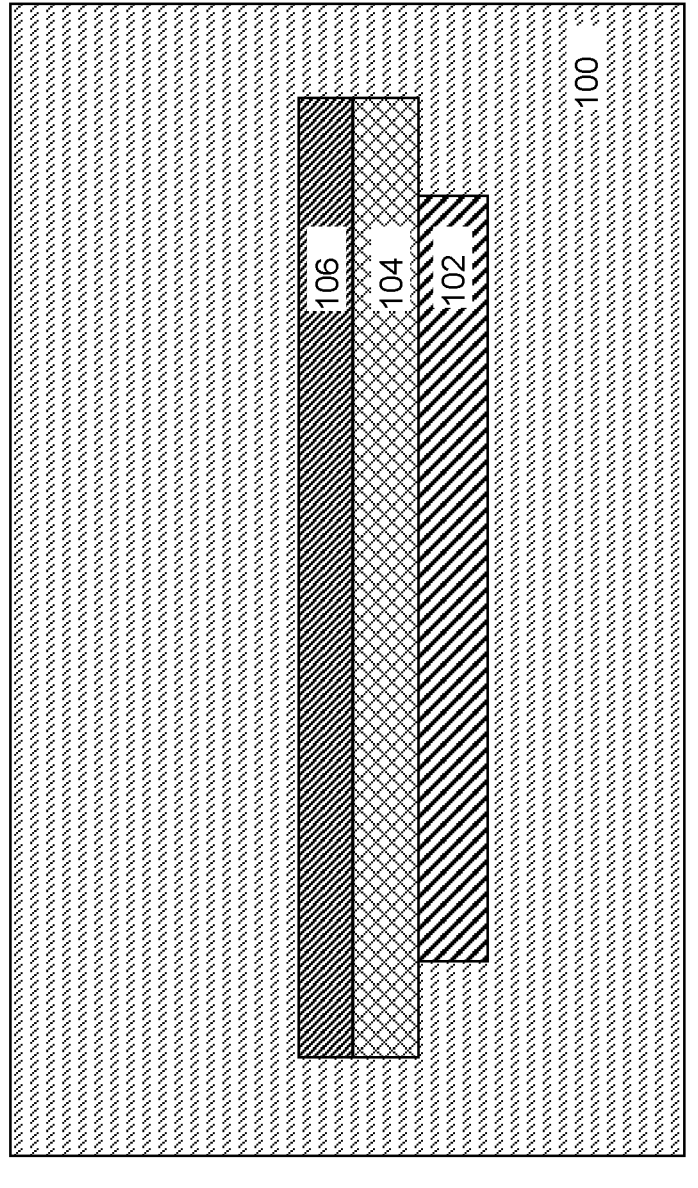
FIG. 8 is a vertical cross sectional view illustrating a step of depositing additional ILD material over the intermediate structure illustrated in FIG. 7A according to an embodiment of the present disclosure.

Referring to FIG. 8, ILD material may be deposited over the intermediate structure illustrated in FIG. 7A (or FIG. 7B) such that the patterned gate electrode 102, patterned high k dielectric layer 104 and patterned first oxide semiconductor layer 106 may be embedded within the ILD layer 100.

Figure 9:
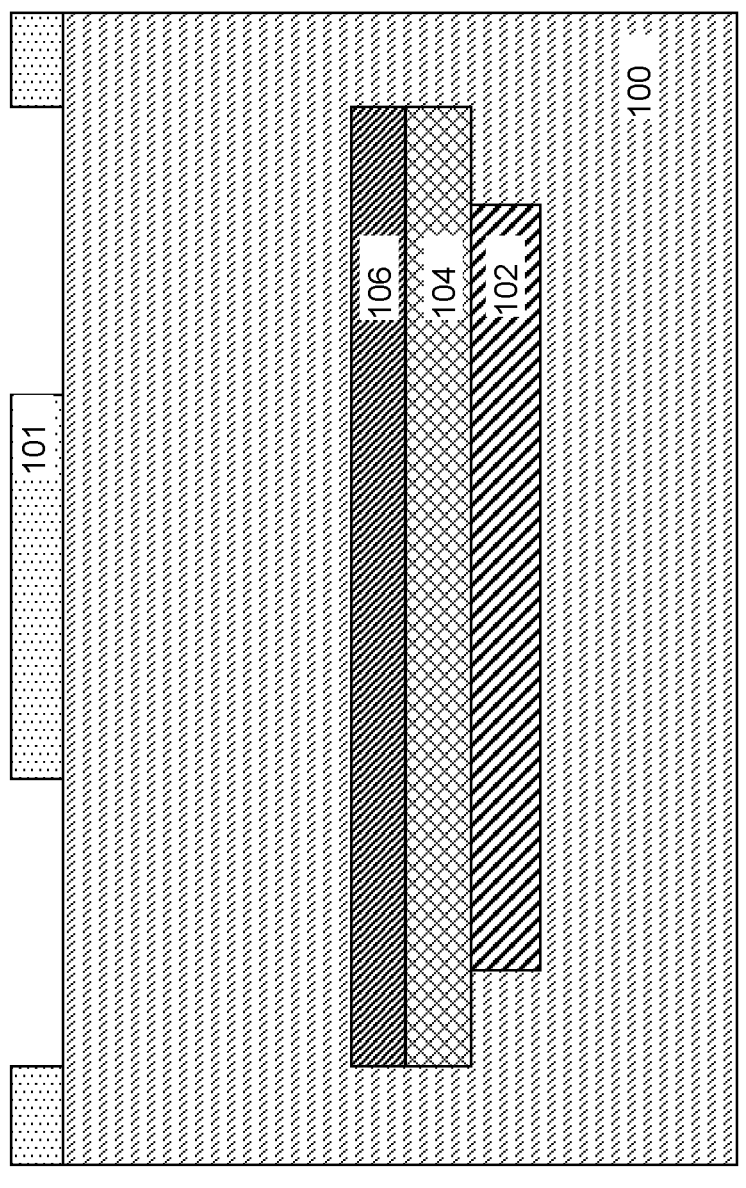
FIG. 9 is a vertical cross sectional view illustrating a step of depositing and patterning a photoresist layer over the intermediate structure illustrated in FIG. 8 according to an embodiment of the present disclosure.

Referring to FIG. 9, a photoresist layer 101 may be deposited and over the ILD layer 100 and patterned through a photolithographic process. The photoresist layer 101 may be made of either a positive or negative photoresist material.

Figure 10:
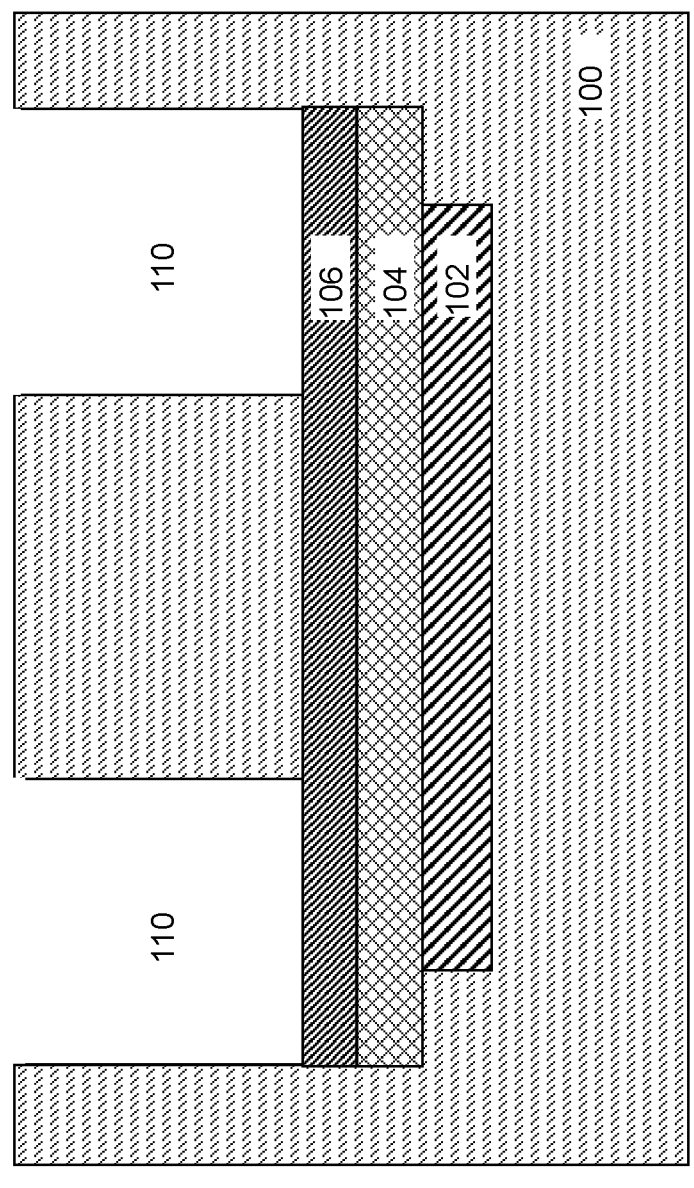
FIG. 10 is a vertical cross sectional view illustrating a step of etching contact via holes the ILD layer using the patterned photoresist layer as a mask according to an embodiment of the present disclosure.

Referring to FIG. 10, the ILD layer 100 may be patterned using the patterned photoresist layer 101 as a mask. The ILD layer 100 may be patterned by wet etching or dry etching. Contact via holes 110 may be etched in the ILD layer 100 until portions of the surface of the patterned first oxide semiconductor layer 106 may be exposed.

Figure 11:
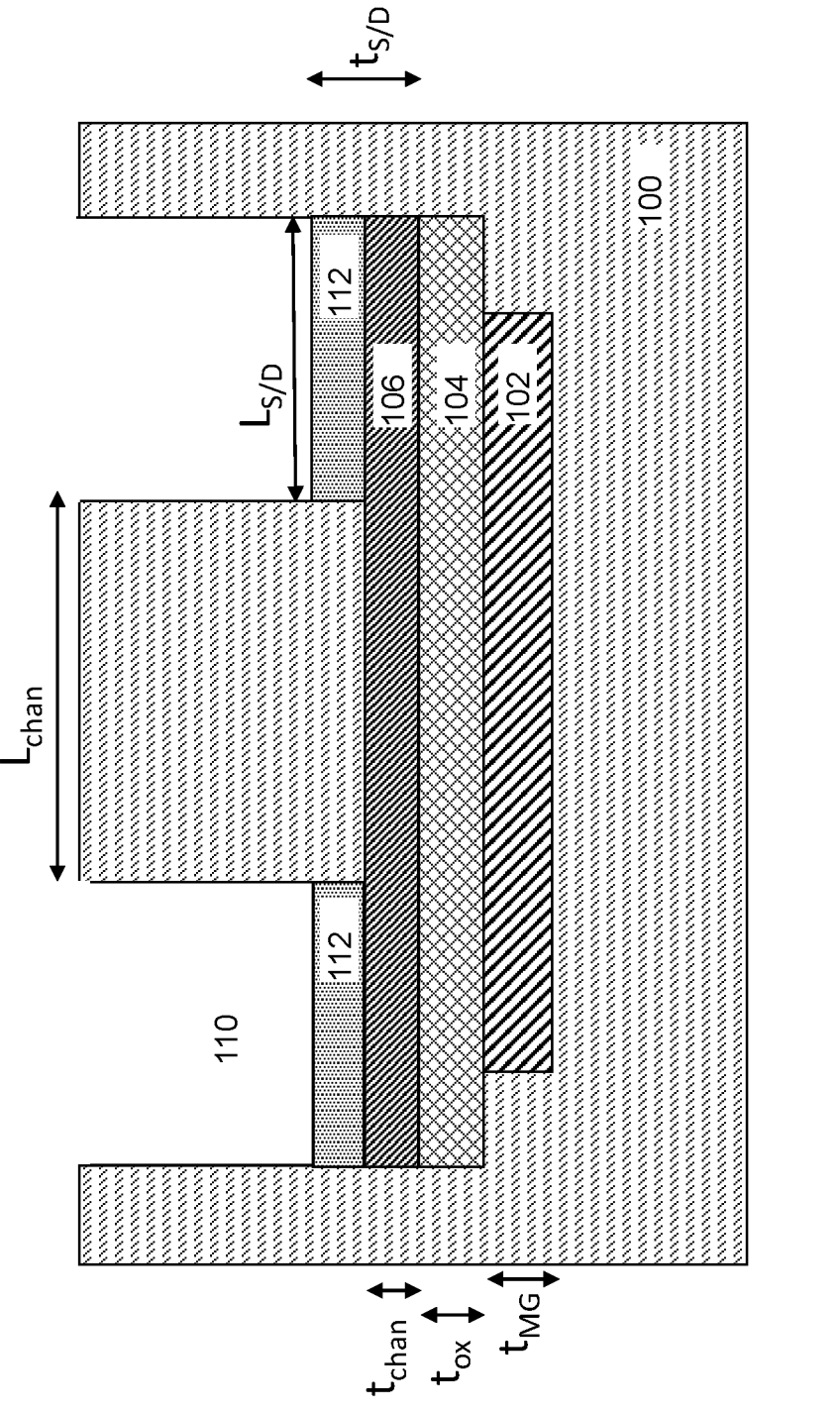
FIG. 11 is a vertical cross sectional view illustrating a step of depositing a layer of semiconducting material in the contact via holes according to an embodiment of the present disclosure.

Referring to FIG. 11, a second oxide semiconductor material may then be deposited in the contact via holes 110 over the exposed portions of the patterned first oxide semiconductor 106 to form patterned second oxide semiconductor layers 112. In this manner, the thickness $t_{S/D}$ of the patterned first and second oxide semiconductor layers 106, 112 in active regions (i.e. source/drain regions) may be thicker than the thickness than in a channel region. In various embodiments, the patterned second oxide semiconductor layer 112 may be made from a different material than the patterned first oxide semiconductor layer 106. In such embodiments, a definitive material interface may exist between the first oxide semiconductor layer 106 and a second oxide semiconductor layer 112. For example, the first oxide semiconductor layer 106 may be formed from an IGZO material. The second oxide semiconductor layer 112 may be formed from an ITO material. The active source/drain regions may be oxygen-poor. Oxygen vacancies may act as donors in oxide semiconductors; having n+ doped materials may be advantageous in the active source/drain regions but undesirable in the channel region.

In alternative embodiments, the patterned second oxide semiconductor layer 112 may be made from the same material as the patterned first oxide semiconductor layer 106. In still other embodiments, the patterned second oxide semiconductor layer 112 may be made from the same material as the patterned first oxide semiconductor layer 106 but having a different doping concentration than the patterned first oxide semiconductor layer 106.

Also illustrated in FIG. 11 are the thickness $T_{MG}$ of the patterned gate electrode 102, the thickness $t_{ox}$ of the high-k dielectric layer 104, the length $L_{chan}$ of the channel region and the length $L_{S/D}$ of the active (source/drain) regions. In various embodiments, the length $L_{chan}$ of the channel region may be in the range of 15-150 nm, such as 25-100 nm, although longer or shorter channel regions may be formed. In various embodiments, the length $L_{S/D}$ of the active regions may be in the range of 15-150 nm, such as 25-100 nm, although longer or shorter active regions may be formed. In various embodiments, the thickness $t_{chan}$ of the patterned first oxide semiconductor layer 106 in the channel region may be in the range of 2-8 nm, such as 4-6 nm, although thicker or thinner channel regions may be formed. In various embodiments, the total thickness $t_{S/D}$ of the patterned first and second oxide semiconductor layers 106, 112 in the active regions may be in the range of 8-16 nm, such as 10-14 nm, although thicker or thinner active regions (source/drain regions) may be formed. In various embodiments, the thickness $t_{ox}$ of the high k dielectric layer 104 may be in the range of 2-8 nm, such as 4-6 nm, although thicker or thinner dielectric layers may be formed. In various embodiments, the thickness $t_{MG}$ of the patterned gate electrode 102 may be in the range of 2-16 nm, such as 4-14 nm, although thicker or thinner metal gate layers may be formed. In various embodiments, the ratio of a thickness $t_{S/D}$ of the source/drain regions to the thickness $t_{chan}$ of the channel region may be in the range of 150:2 to 15:8. Thus, a thinner channel exhibiting semiconducting properties may be formed, while thicker active regions may be formed to exhibit better conducting properties at the electrode contact areas.

Figure 12A:
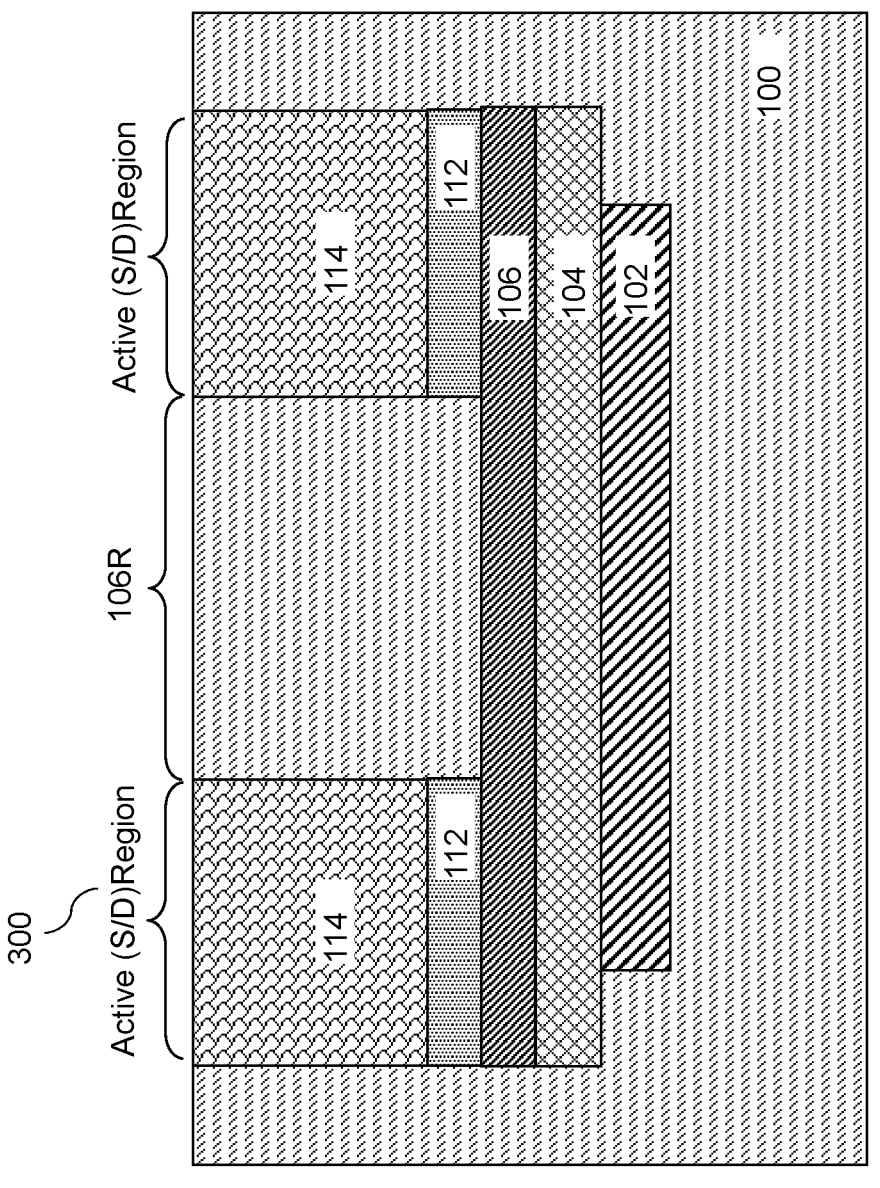
FIG. 12A is a vertical cross sectional view illustrating a step of depositing contact metal in the contact via holes above the layer of dielectric material in the contact via holes according to an embodiment of the present disclosure.

Referring to FIG. 12A, the remaining volume in the contact via holes 110 may be filled with a conducting material to form contacts 114 to the active regions. The conducting material may be Al, Cu, W, Ti, Ta, TiN, TaN, TiAl or combinations thereof. Other suitable conducting materials are within the contemplated scope of disclosure. In this manner, a transistor 300 may be completed. In this embodiment, the transistor 300 is a back gate transistor, i.e. the patterned gate electrode 102 is located below the channel region 106R. The embodiment illustrated in FIG. 12A may be easily scalable. In addition, the embodiment illustrated in FIG. 12A may be formed by depositing the second oxide semiconductor layers 112 through a PVD process, which is an inexpensive deposition process relative to other deposition processes such as ALD. However, in order to achieve the desired thickness of the deposited second oxide semiconductor layers 112, the second oxide semiconductor layers 112 are often overfilled and then an etchback process may be performed. Since there is no etch stop layer, the etch back process must be delicately controlled.

Figure 12B:
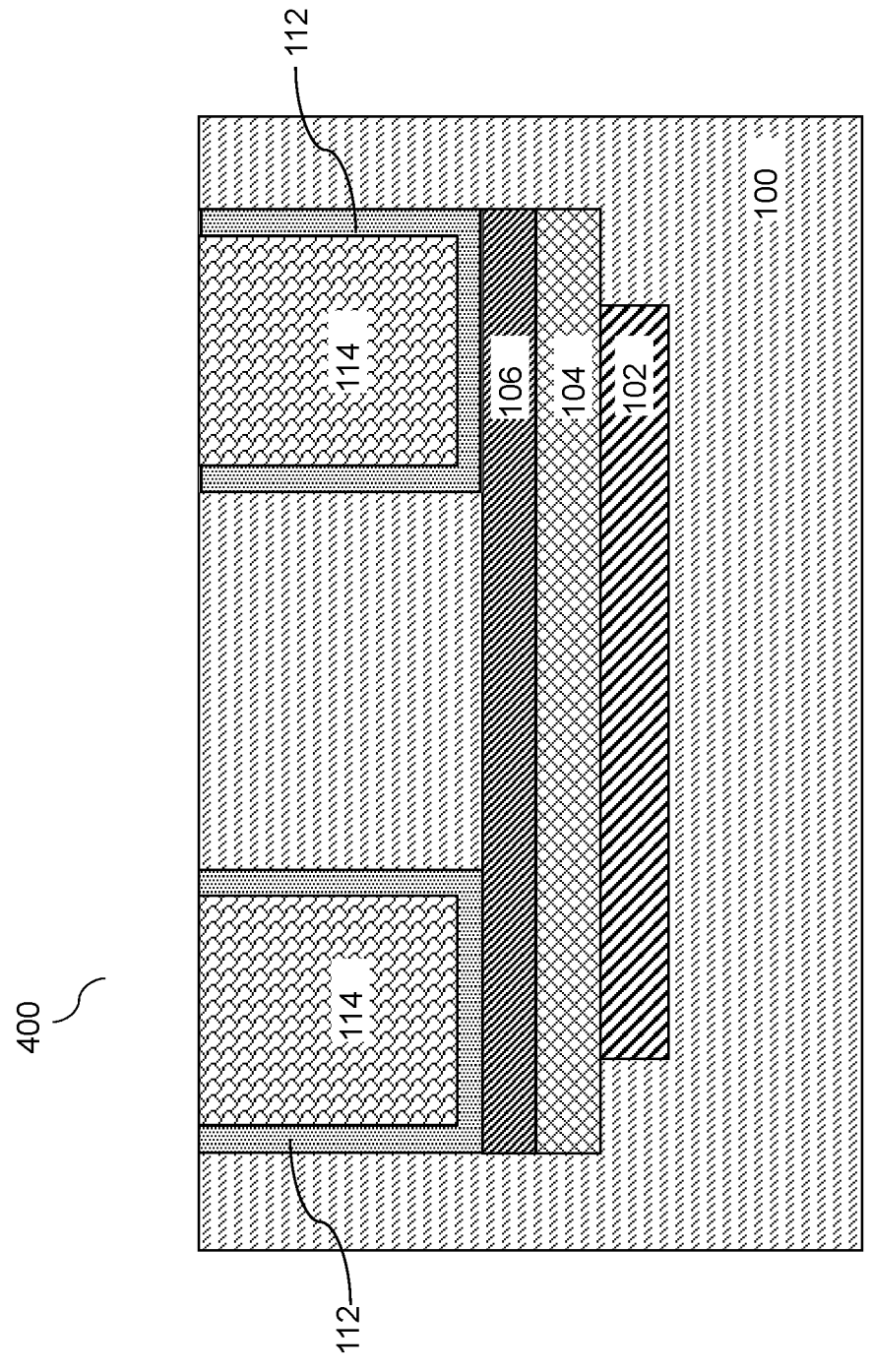
FIG. 12B is a vertical cross sectional view illustrating an alternative embodiment in which the layer of semiconducting material is conformally deposited on the sides and bottom of the contact via holes.

FIG. 12B illustrates an alternative embodiment with an alternative configuration of the patterned second oxide semiconductor layer 112 and the contacts 114. In this embodiment, the patterned second oxide semiconductor layer 112 may be conformally deposited in the contact via holes 110 in the ILD layer 100. For example, an ALD process may be used to conformally deposit the second oxide semiconductor layer 112 on the sidewalls and the bottom of the contact via holes 110 in the ILD layer 100. An ALD process may be flexible to allow for the deposition of a variety of IGZO compositions. For example, in an ALD process, the InGaZNo may be formed by cycling Indium, Gallium and Zinc. For an Indium rich compositions, additional Indium cycles may be performed during the ALD process. Next, the contact via holes 110 may be filled with conducting material to form the contacts 114 as in the previous embodiment. The alternative embodiment illustrated in FIG. 12B may provide for a larger surface area interface between the metal contact 114 and the source/drain region. Thus, a lower contact resistance may be provided. However, such embodiments may not be as scalable as other embodiments. Since second oxide semiconductor layer 112 may be conformally deposited on both the sidewalls of a contact via, as the contact via cross sectional area decreases, the area available for the metal contact 114 material also decreases.

Figure 13:
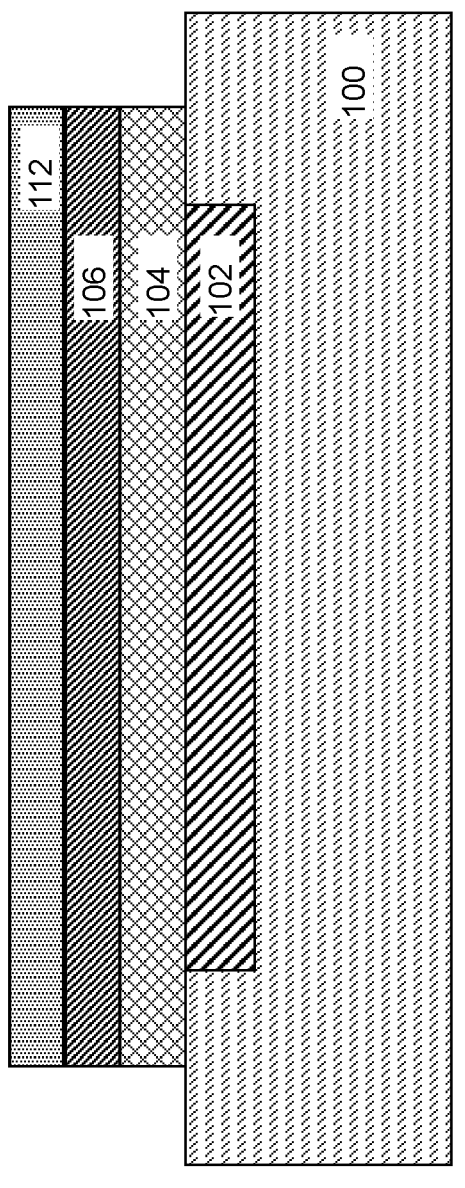
FIG. 13 is a vertical cross sectional view illustrating a step of depositing and forming a patterned high k dielectric layer, a first patterned oxide semiconductor layer and a second patterned oxide semiconductor layer according to an embodiment of the present disclosure.

Referring to FIG. 13, a step in an alternative method is illustrated. Starting with the intermediate structure illustrated in FIG. 5, a continuous second oxide semiconductor layer 112L may be formed over the continuous first oxide semiconductor layer 106L and the continuous high k dielectric layer 104L. In some embodiments, the continuous first oxide semiconductor layer 106L and the continuous second oxide semiconductor layer 112L may be formed in one ALD process. As noted above, the ALD process may be flexible to allow for the deposition of a variety of IGZO compositions. By modifying the cycling of material in the ALD process, the different compositions of the continuous first oxide semiconductor layer 106L and the continuous second oxide semiconductor layer 112L may be achieved. Next, as illustrated in FIGS. 6 and 7A, a photoresist layer 101 may be deposited over the surface of the continuous second oxide semiconductor layer 112L and patterned. Then, similar to the step illustrated in FIG. 7A, the continuous second oxide semiconductor layer 112L, the continuous first oxide semiconductor layer 106L and the continuous high k dielectric layer 104L may be patterned to form a patterned second oxide semiconductor layer 112, a patterned first oxide semiconductor layer 106 and a patterned high-k dielectric layer 104.

Figure 14:
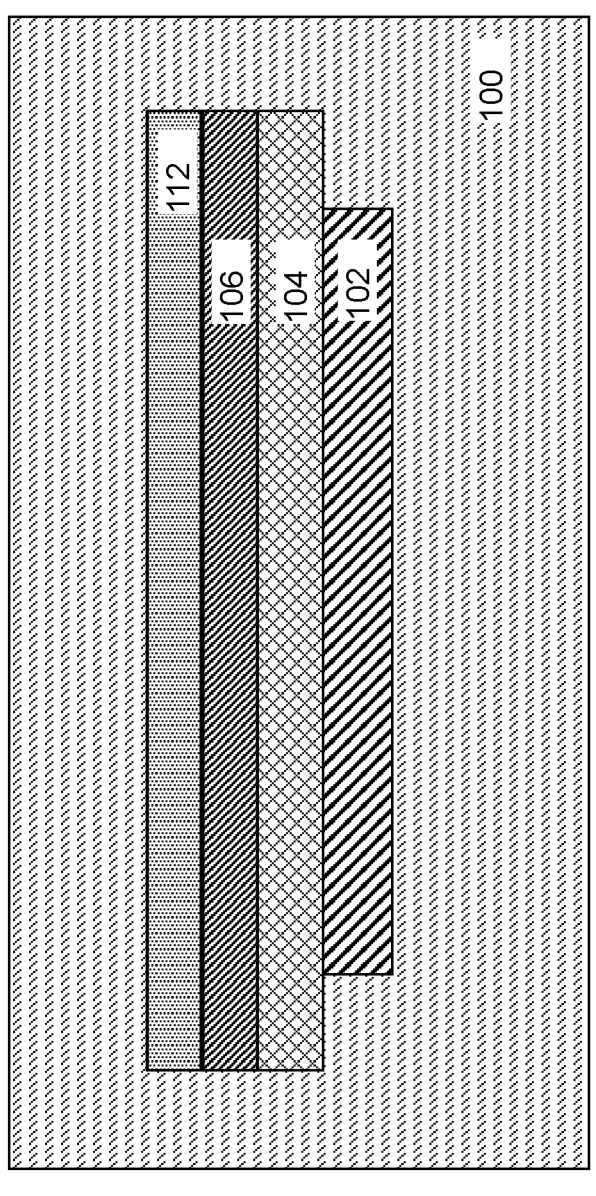
FIG. 14 is a vertical cross sectional view illustrating a step of depositing additional ILD material over the intermediate structure illustrated in FIG. 13 according to an embodiment of the present disclosure.

Referring to FIG. 14, ILD material, similar to the step illustrated in FIG. 8, may be deposited over the intermediate structure illustrated in FIG. 13. Thus, in this manner, the patterned second oxide semiconductor layer 112, the patterned first oxide semiconductor layer 106 and the patterned high k dielectric layer 104 may be embedded within the ILD layer 100.

Figure 15:
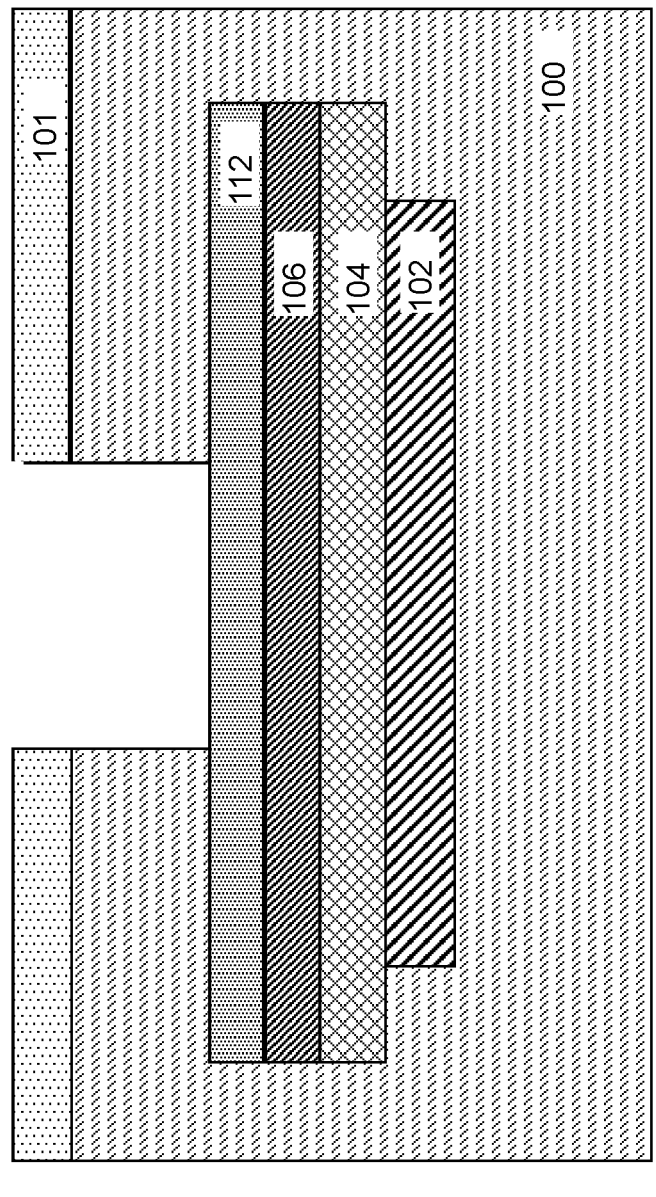
FIG. 15 is a vertical cross sectional view illustrating a step of deposing and patterning a photoresist layer the inter over the intermediate structure illustrated in FIG. 14 and using the patterned photoresist layer as a mask to etch the ILD layer and expose a top surface of the second oxide semiconductor layer according to an embodiment of the present disclosure.

Referring to FIG. 15, a photoresist layer 101 may be deposited over the ILD layer 100 and patterned through a photolithographic process. Then, the ILD layer 100 may be etched to expose a portion of surface of the patterned second oxide semiconductor layer 112 in a channel region. The etching step may be performed by wet etching or dry etching.

Figure 16:
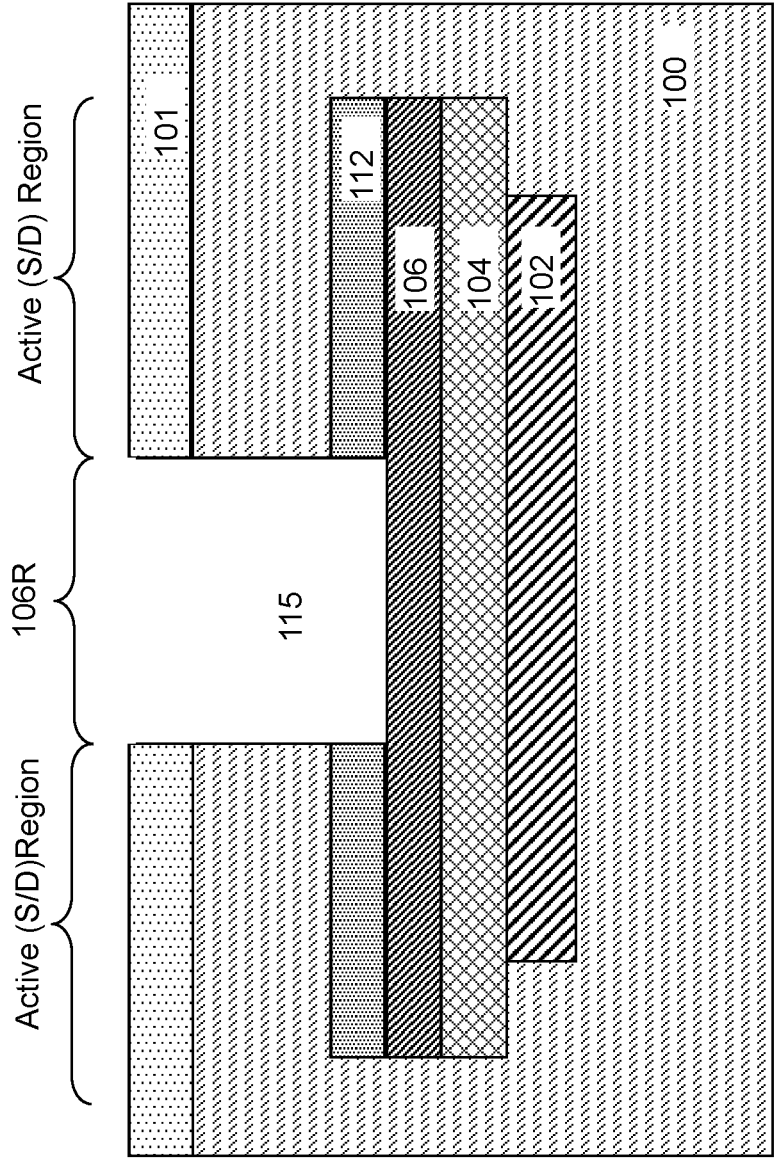
FIG. 16 is a vertical cross sectional view illustrating a step of etching a portion of the second oxide semiconductor layer according to an embodiment of the present disclosure.

Referring to FIG. 16, a further anisotropic etch process may be performed to selective remove the exposed portion 115 of the patterned second oxide semiconductor layer 112. For example, the further etch process use a dry etching or wet etching process. In this manner, the channel region 106R may made thinner than the active regions. In some embodiments, the photoresist layer 101 may be removed prior to the further etch process that remove the patterned second oxide semiconductor layer 112. In other embodiments, the photoresist layer 101 may be removed after the further etch process to remove the patterned second oxide semiconductor layer 112. The photoresist layer 101 may be removed, for example, by ashing or dissolving the photoresist layer 101.

Figure 17:
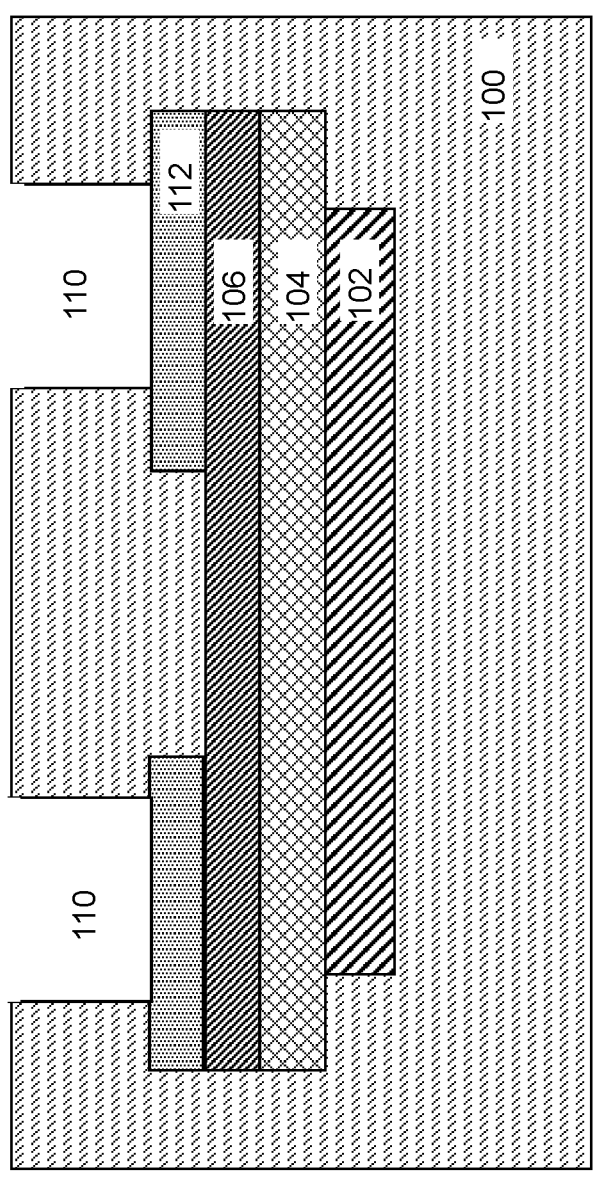
FIG. 17 is a vertical cross sectional view illustrating a step of forming contact via holes extending to the second oxide semiconductor layer according to an embodiment of the present disclosure.

Referring to FIG. 17, ILD material may be deposited over the intermediate structure illustrated in FIG. 16 to fill the exposed portion 115 in the channel region 106R. Then a photoresist layer (not shown) may be deposited over the ILD layer 100 and patterned to expose portions of the ILD layer 100 over the active regions. Portions of the ILD layer 100 over the active regions may be etched to form contact via holes 110 to a top surface of the patterned second oxide semiconductor layer 112 in the active regions.

Figure 18A:
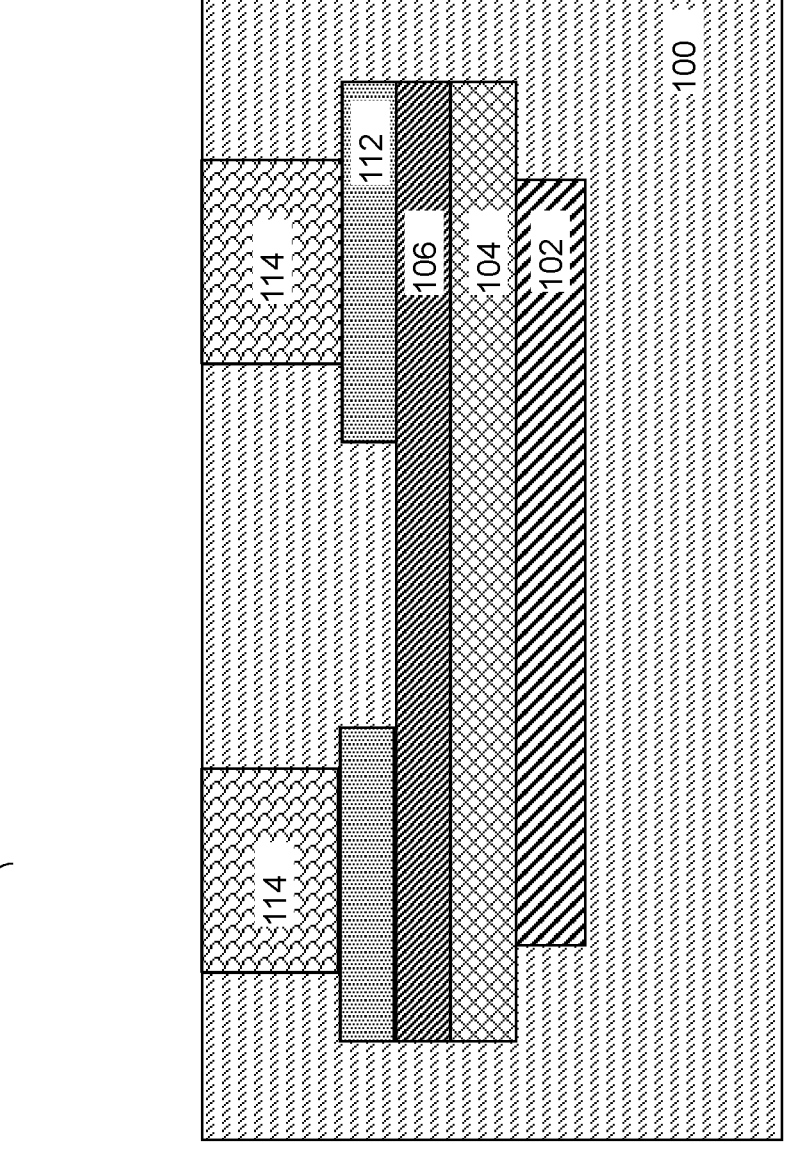
FIG. 18A is a vertical cross sectional view illustrating a step of filling the contact via holes to form metal contacts according to an embodiment of the present disclosure.

Referring to FIG. 18A, the contact via holes 110 may be filled with a conductive material to form contacts 114 to the active regions. The conducting material may be Al, Cu, W, Ti, Ta, TiN, TaN, TiAl or combinations thereof. Other suitable conducting materials are within the contemplated scope of disclosure. In this manner, a transistor 500 may be completed.

Figure 18B:
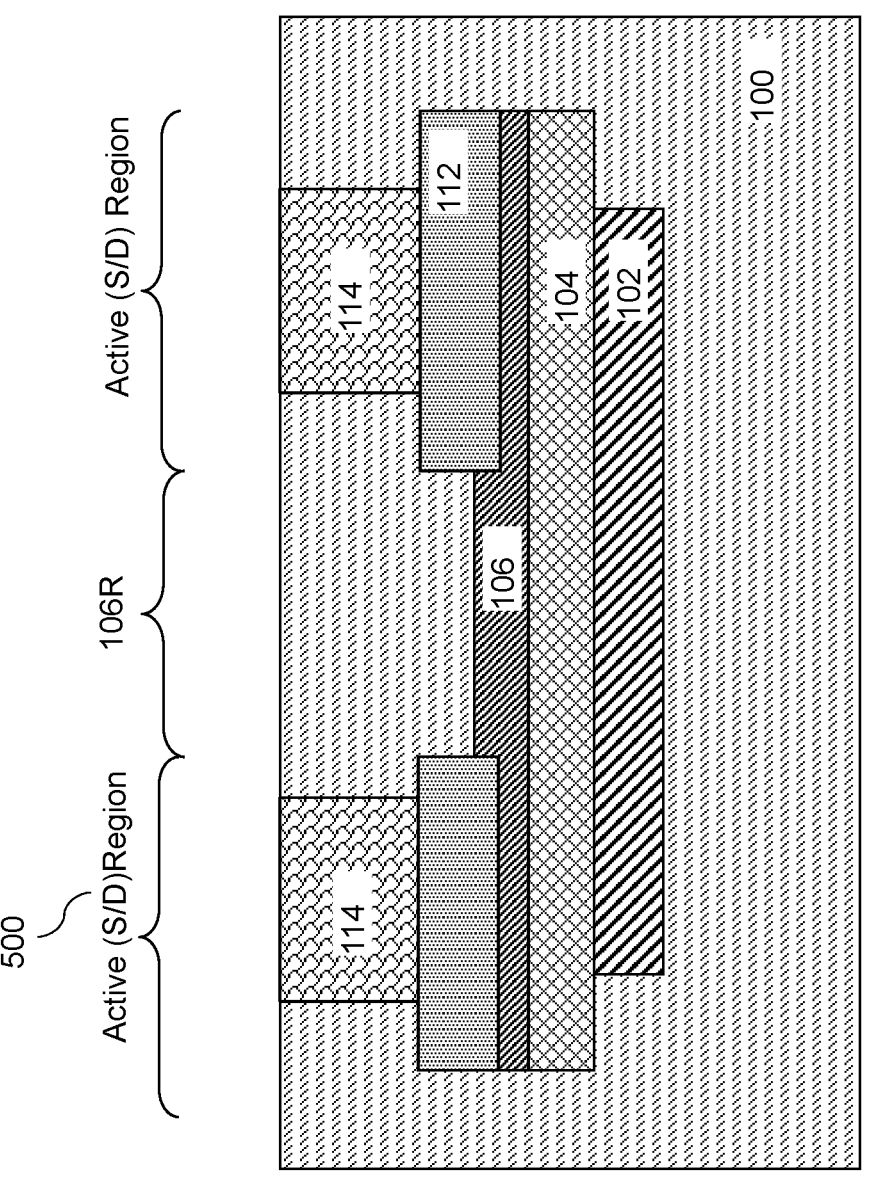
FIG. 18B is a vertical cross sectional view illustrating a transistor in which a portion of the patterned first oxide semiconductor layer over the active regions is replaced with the patterned second oxide semiconductor layer according to an embodiment of the present disclosure.

FIG. 18B illustrates an alternative embodiment in which a portion of the patterned first oxide semiconductor layer 106 over the active regions may be removed. For example, starting with the intermediate structure illustrated in FIG. 5, the patterned photoresist layer (not shown) may be used as a mask to etch the continuous high k dielectric layer 104L and the continuous first oxide semiconductor layer 106L such that a patterned high-k dielectric layer 104 and a patterned first oxide semiconductor layer 106 are formed. In addition, the patterned photoresist layer (not shown) may be used to mask portions of the semiconductor layer 106 in the channel region 106 such that portions of the first oxide semiconductor layer 106 in the eventual active regions may be removed. The removed portion of the first oxide semiconductor layer 106 may be replaced with the patterned second oxide semiconductor layer 112. Thus, the material interface between the patterned first oxide semiconductor layer 106 and the second oxide semiconductor layer 112 may be more complex than a simple straight line interface.

Figure 18C:
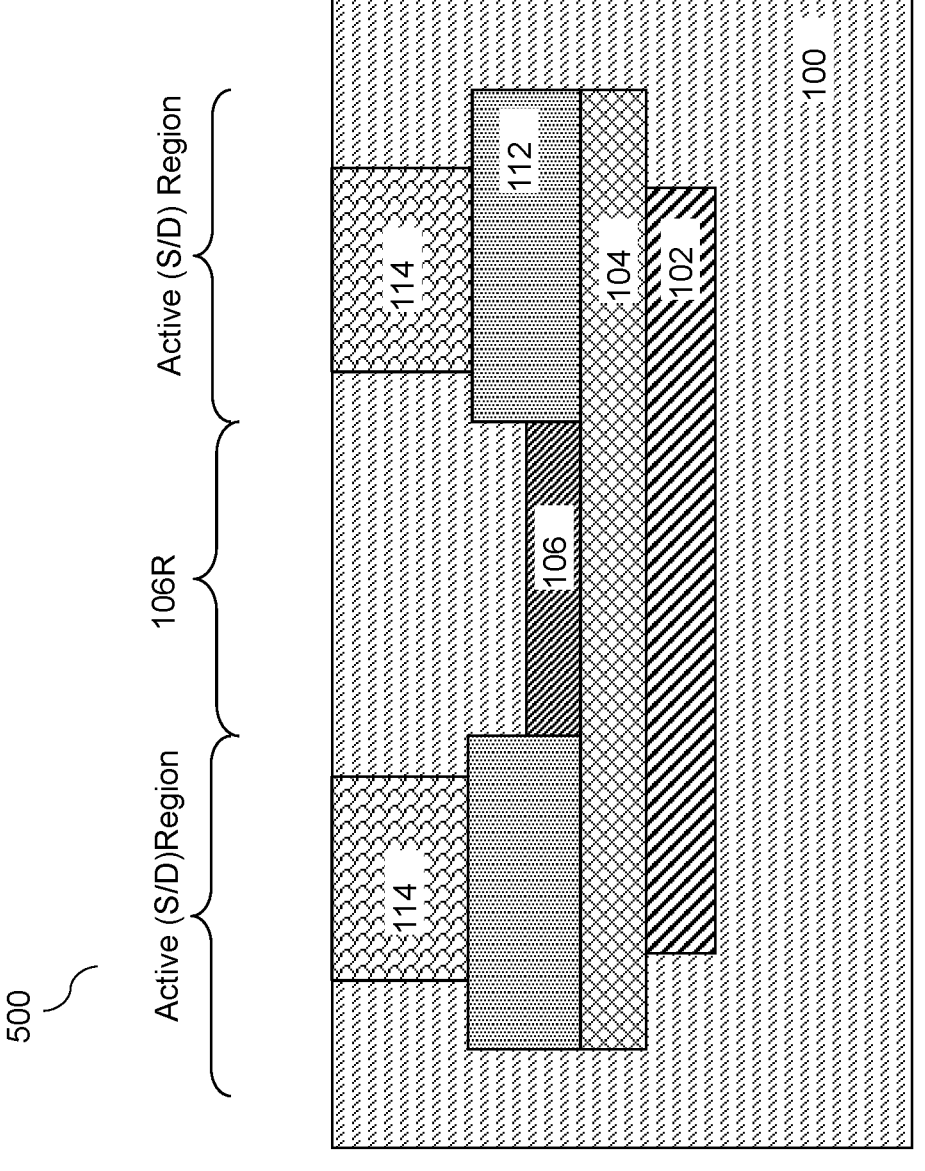
FIG. 18C is a vertical cross sectional view illustrating a transistor in which all of the patterned first oxide semiconductor layer over the active regions is replaced with the patterned second oxide semiconductor layer according to an embodiment of the present disclosure.
Figure 18D:
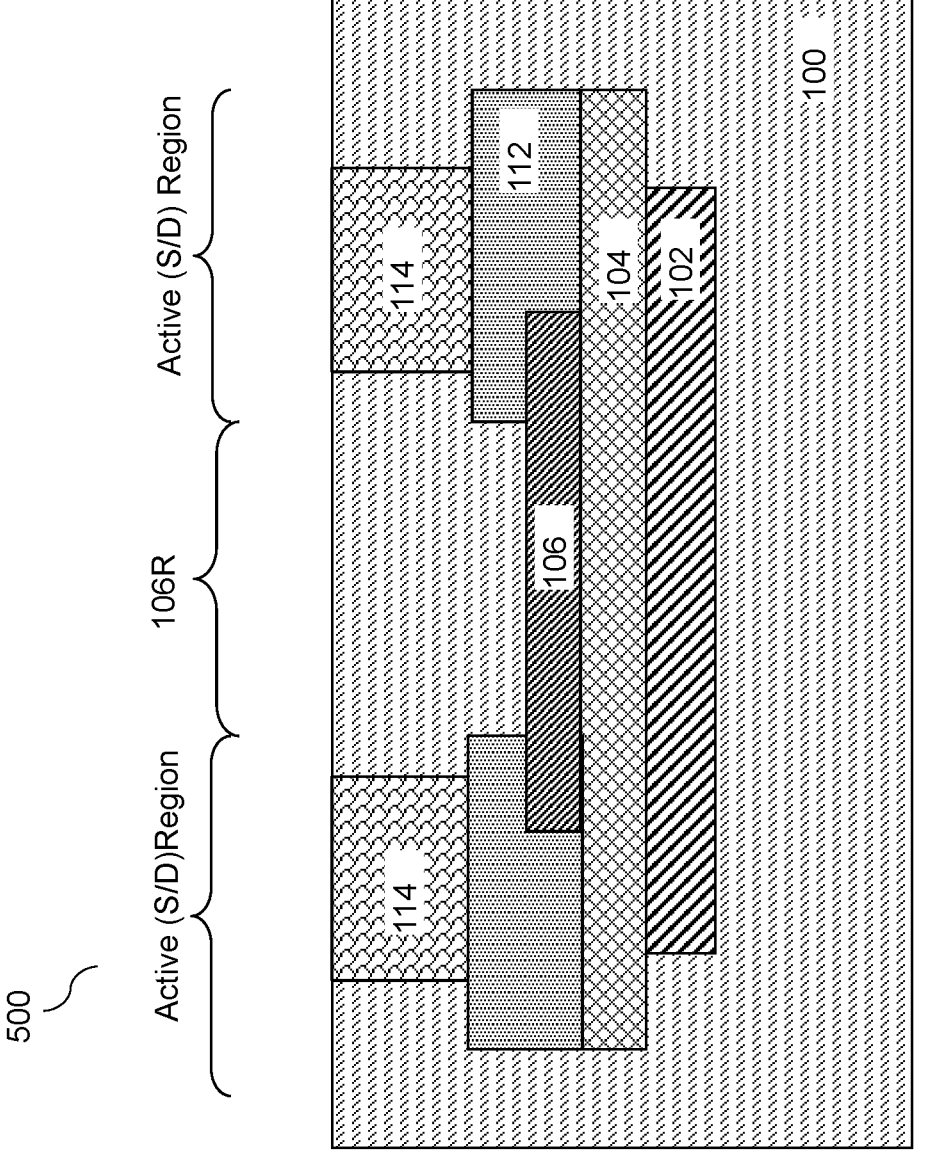
FIG. 18D is a vertical cross sectional view illustrating a transistor in which a portion of the patterned first oxide semiconductor layer over the active regions is replaced with the patterned second oxide semiconductor layer and a portion of the patterned second oxide semiconductor layer is formed over a portion of the first patterned oxide semiconductor layer according to an embodiment of the present disclosure.

That is, as illustrated in FIG. 18B and FIG. 18D discussed in more detail below, the interface between the patterned first oxide semiconductor layer 106 and the second oxide semiconductor layer 112 may include multiple surfaces to form a step shape. As shown in FIGS. 18B and 18D, the interface between the patterned first oxide semiconductor layer 106 and the second oxide semiconductor layer 112 may include both a vertical and horizontal surface. In the embodiment illustrated in FIG. 18B, the patterned first oxide semiconductor layer 106 may underlay the full width of each of the source and drain regions of the patterned second oxide semiconductor layer 112.

FIG. 18C illustrates an alternative embodiment in which all of the patterned first oxide semiconductor layer 106 over the active regions may be removed and replaced with the patterned second oxide semiconductor layer 112.

FIG. 18D illustrates an yet another alternative embodiment in which, a portion of the patterned first oxide semiconductor layer 106 overlapping the active regions may be replaced with the patterned second oxide semiconductor layer 112 and a portion of the patterned second oxide semiconductor layer 112 may be formed over a portion of the first patterned oxide semiconductor layer 106. As discussed above with respect to the embodiment shown in FIG. 18B, the interface between the patterned first oxide semiconductor layer 106 and the second oxide semiconductor layer 112 may include multiple surfaces to form a step shape. The interface between the patterned first oxide semiconductor layer 106 and the second oxide semiconductor layer 112 may include both a vertical and horizontal surface. In contrast to the embodiment illustrated in FIG. 18B, in the embodiment illustrated in FIG. 18D, the patterned first oxide semiconductor layer 106 may underlay a portion of the width of each of the patterned second oxide semiconductor layer 112 portions. The alternative embodiments illustrated in FGIS. 18A-18D vary the configuration of the interface between the patterned first oxide semiconductor layer 106 and the second oxide semiconductor layer 112. By varying the amount the source/drain layer in the second oxide semiconductor layer 112 intrudes on the channel region 106R, the resistance of the source/drain contact may be modified. By extending the second oxide semiconductor layer 112 into the channel region 106R, the source/drain region resistance may be lowered. However, such complex interfaces may require greater process control during fabrication.

Figure 19:
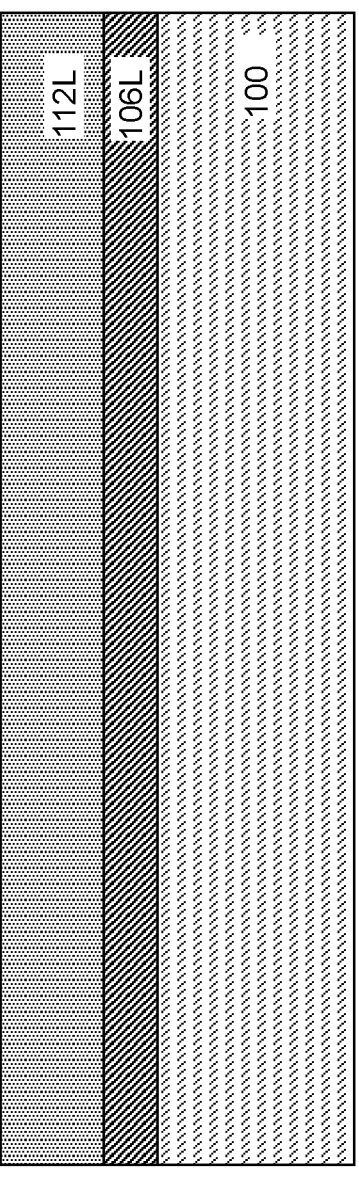
FIG. 19 is a vertical cross sectional view illustrating a step of depositing a continuous first oxide semiconductor layer and a continuous second oxide semiconductor layer on an ILD layer according to an embodiment of the present disclosure.

Referring to FIG. 19, a method of making a top or front gate thin film transistor according to another embodiment is illustrated. In a first step, a continuous first oxide semiconductor layer 106L may be deposited over and ILD layer 100. Next, a continuous second oxide semiconductor layer 112L may be deposited over the continuous first oxide semiconductor layer 106L.

Figure 20:
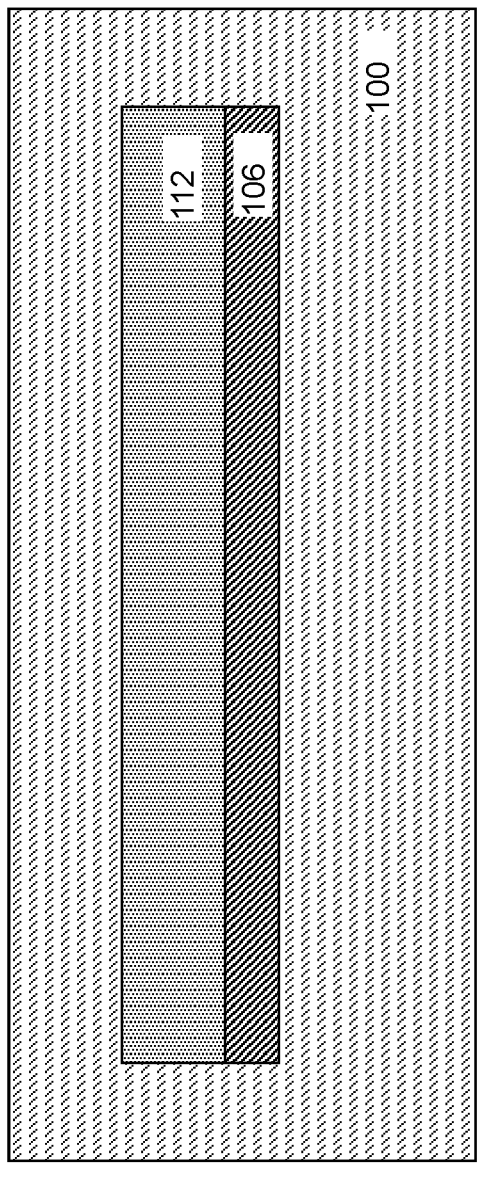
FIG. 20 is a vertical cross sectional view illustrating a step of forming a patterned first oxide semiconductor layer and a patterned second oxide semiconductor layer on an ILD layer according to an embodiment of the present disclosure.

Referring to FIG. 20, the continuous second oxide semiconductor layer 112L and the continuous first oxide semiconductor layer 106L may be patterned. Patterning may be accomplished by covering the continuous second oxide semiconductor layer 112L with a photoresist layer (not shown) and patterning the photoresist. The patterned photoresist may be used as a mask to pattern the continuous second oxide semiconductor layer 112L and the continuous first oxide semiconductor layer 106L to form a patterned second oxide semiconductor layer 112 and a patterned first oxide semiconductor layer 106. Next, additional ILD material 100 may be deposited over the patterned second oxide semiconductor layer 112 and the patterned first oxide semiconductor layer 106 such that the patterned second oxide semiconductor layer 112 and the patterned first oxide semiconductor layer 106 may be embedded within the ILD layer 100.

Figure 21:
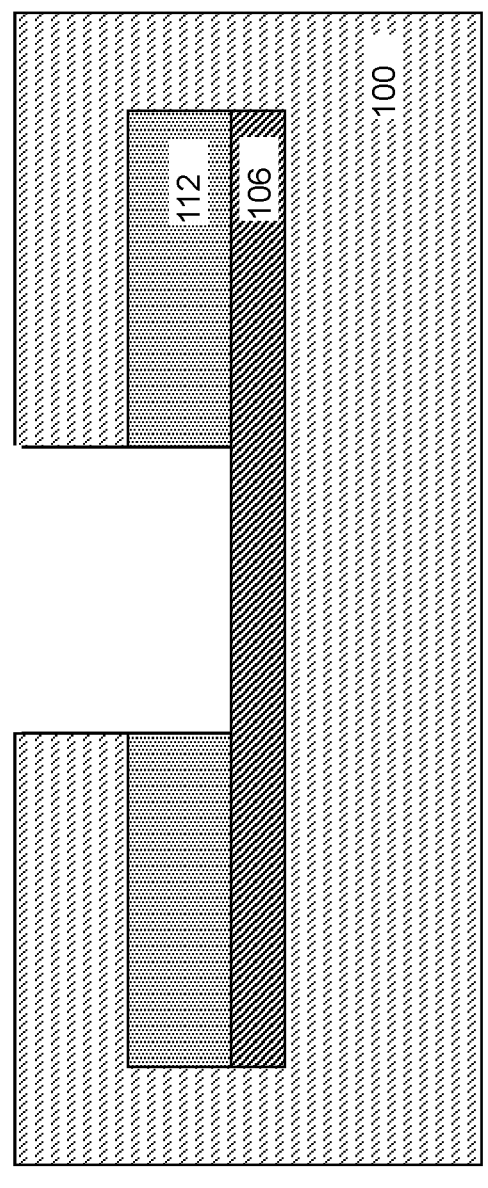
FIG. 21 is a vertical cross sectional view illustrating a step of etching the patterned second oxide semiconductor layer to form a channel region according to an embodiment of the present disclosure.

Referring to FIG. 21, the ILD layer 100 and the patterned second oxide semiconductor layer 112 may be etched in a channel region to form a trench in the ILD layer 100 and the patterned second oxide semiconductor layer 112. Etching may be accomplished by first depositing a photoresist layer (not shown) and patterning the photoresist layer. The ILD layer 100 and the patterned second oxide semiconductor layer 112 may be etched in the same step with the same etchant or in sequential etching steps. The ILD layer 100 and the patterned second oxide semiconductor layer 112 may be wet etched or dry etched.

Figure 22:
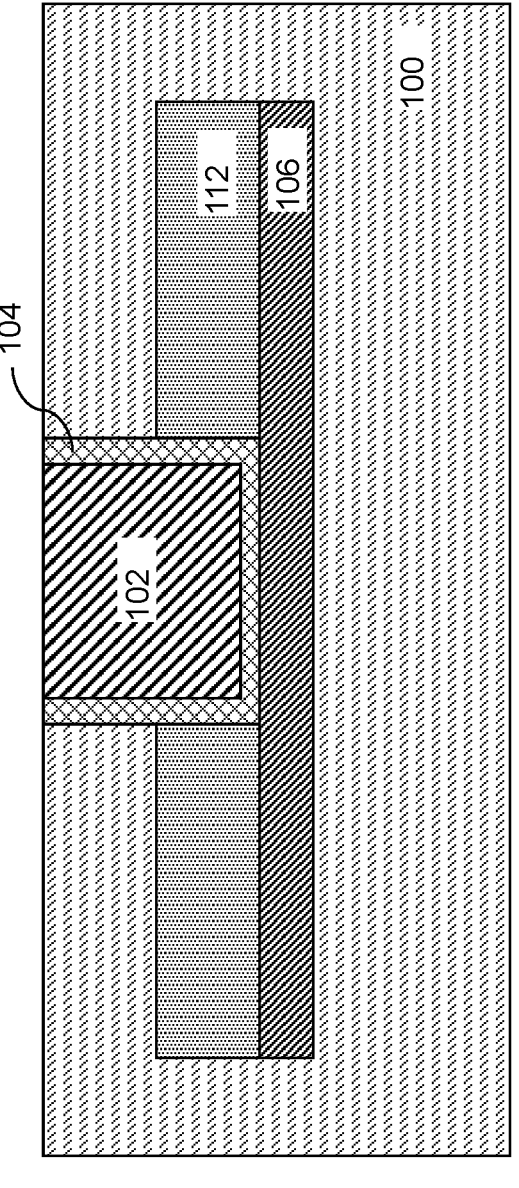
FIG. 22 is a vertical cross sectional view illustrating a step of depositing a conformal high k dielectric layer and depositing metal over the high k dielectric material for form a gate electrode according to an embodiment of the present disclosure.

Referring to FIG. 22, a high k dielectric layer 104 may be conformally deposited on the sidewalls and the bottom of the trench in the ILD layer 100 and the patterned second oxide semiconductor layer 112. Next, the remaining volume of the trench may be filled with a gate electrode material to form a patterned gate electrode 102 over the channel region.

Figure 23:
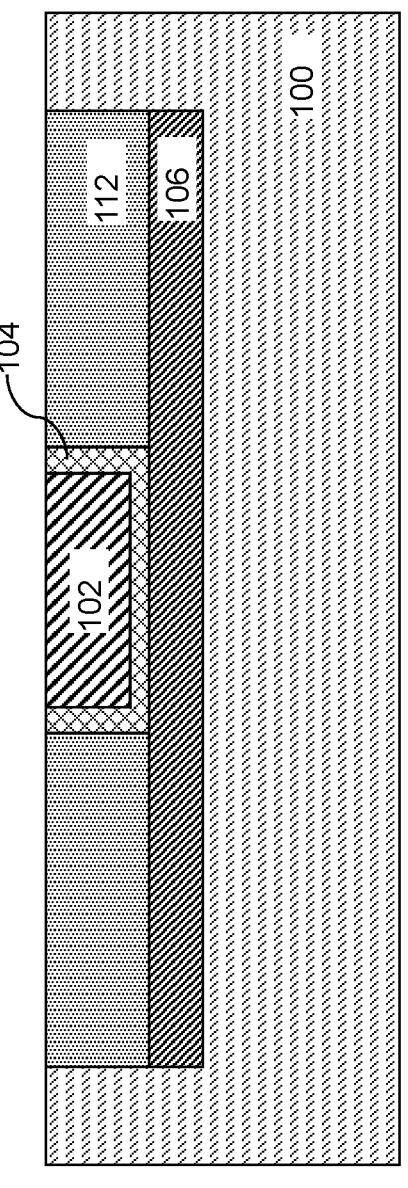
FIG. 23 is vertical cross sectional view illustrating a step of planarizing the intermediate structure illustrated in FIG. 22 according to an embodiment of the present disclosure.

Referring to FIG. 23, the surface of the intermediate structure illustrated in FIG. 21 may be planarized to remove any excess high-k dielectric material 104 and/or any excess gate electrode 102 material. Planarization may be accomplished by chemical-mechanical polishing. Following the planarization, the tope surfaces of the ILD 100, patterned second oxide semiconductor layer 112, high-k dielectric material 104, and gate electrode 102 may be co-planar.

Figure 24A:
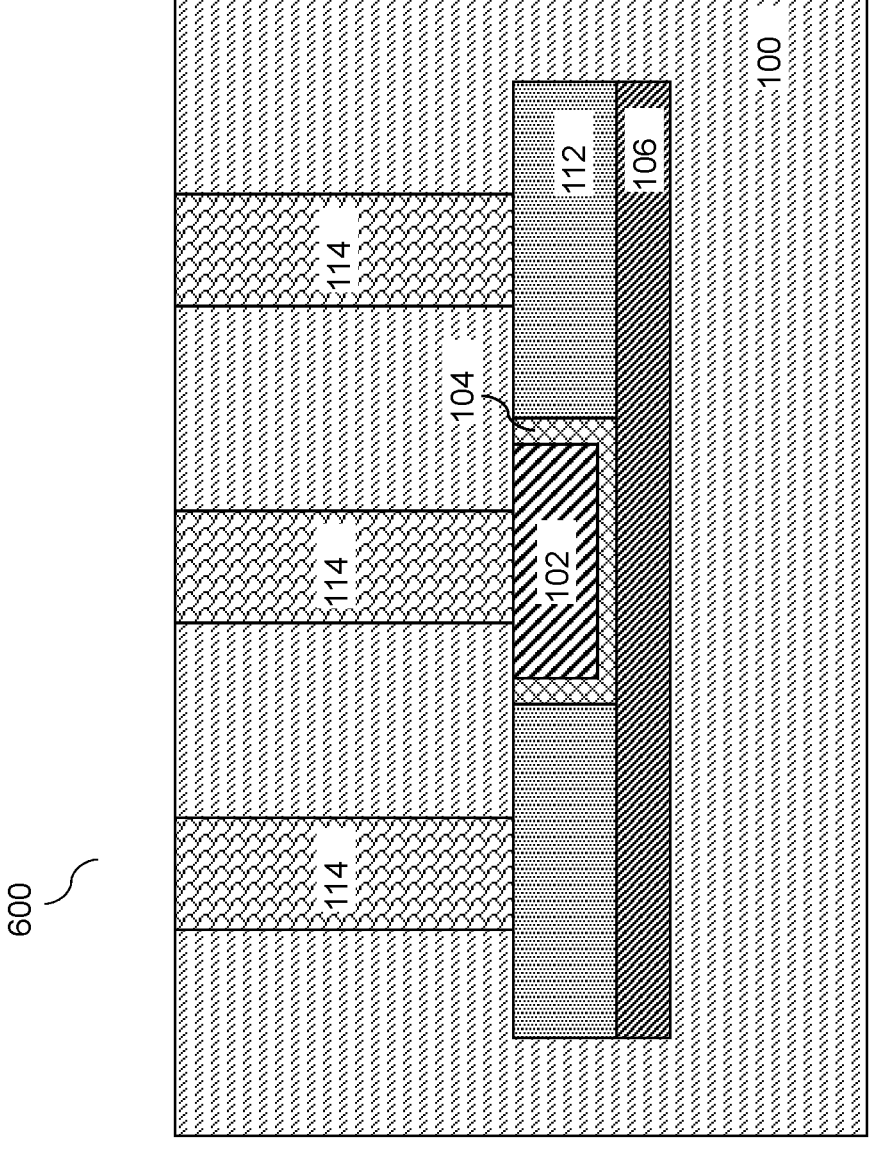
FIG. 24A is a vertical cross sectional view illustrating a step of depositing additional ILD layer material and forming metal contacts to the active regions and the gate electrode according to an embodiment of the present disclosure.

Referring to FIG. 24A, additional ILD material may be deposited over the intermediate structure illustrated in FIG. 23. Next, contact via holes (not shown) may be formed in the ILD layer 100. In various embodiments, contact via holes are formed that expose top surfaces of the patterned second oxide semiconductor layer 112 in active regions and expose a top surface of the patterned gate electrode 102 in a channel region. In this manner, a transistor 600 may be completed. In this embodiment, the transistor 600 is a top gate transistor.

Figure 24B:
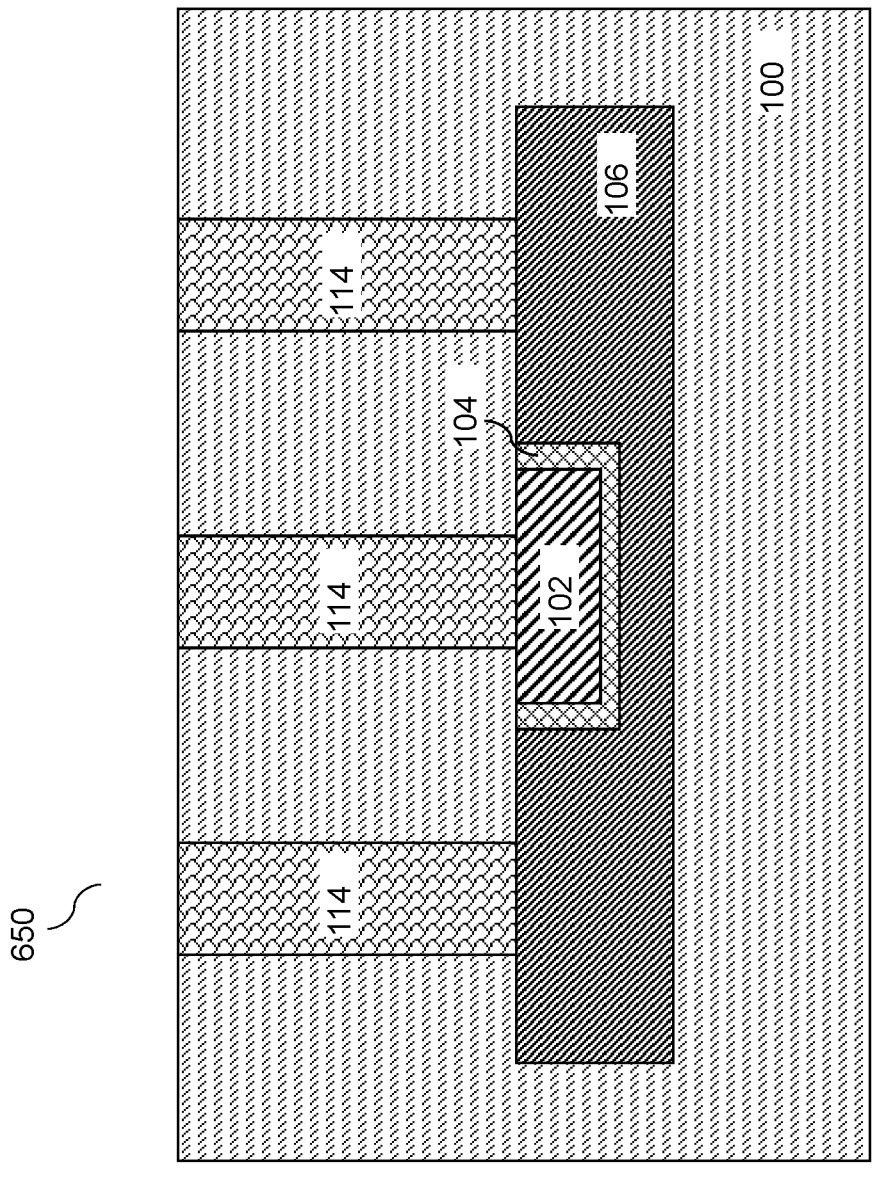
FIG. 24B a vertical cross sectional view illustrating a transistor according to an alternative embodiment of the present disclosure.

FIG. 24B illustrate a transistor 650 according to an alternative embodiment. In this embodiment, the transistor 650 only includes patterned first oxide semiconductor layer 106. Referring FIG. 19, rather than deposit both a continuous first oxide semiconductor layer 106L and a continuous second oxide semiconductor layer 112L, a single continuous first oxide semiconductor layer 106L with a thickness approximately equal to the combined thicknesses of the continuous first oxide semiconductor layer 106L and the continuous second oxide semiconductor layer 112L of the previous embodiment, may be deposited over the ILD layer 100. Processing continues as illustrated in FIGS. 20-24A above, resulting in the transistor 650. Since the embodiment illustrated in FIG. 24B includes a single continuous first oxide semiconductor layer 106L the processing steps to form transistor 650 may be simplified.

Figure 25:
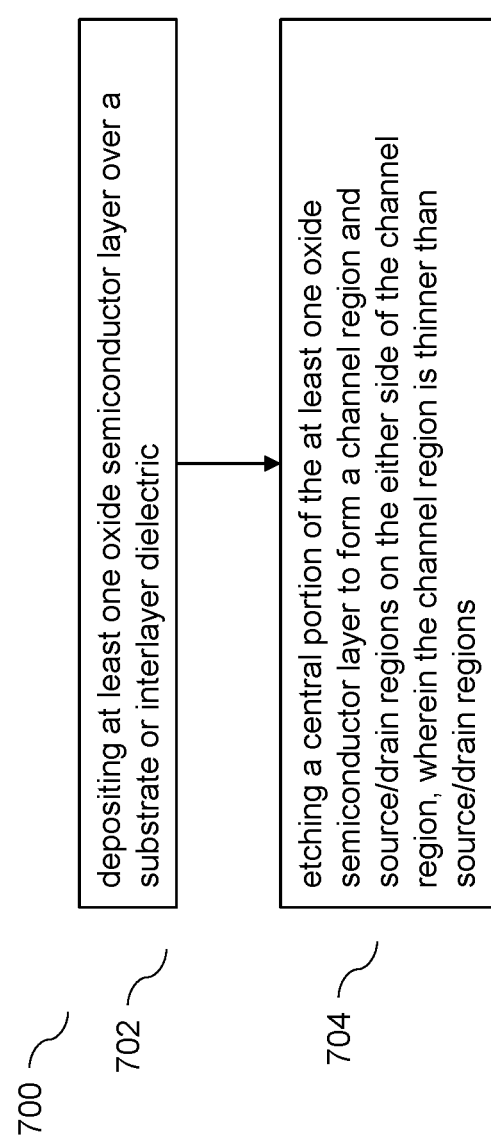
FIG. 25 is a flowchart that illustrates general processing steps of embodiment methods of the present disclosure.

FIG. 25 is a flow diagram illustrating an embodiment method 700 of making a transistor 300, 400, 500. Referring to step 702, the method 700 includes depositing at least one oxide semiconductor layer 106, 112 over a substrate or interconnect level dielectric layer 100. Referring to step 704, the method 700 includes etching a central portion of the at least one oxide semiconductor layer 106, 112 to form a channel region 106R and source/drain regions on either side of the channel region 106R, wherein the overall thickness of the channel region 106R is thinner than the overall thickness of the source/drain regions.

FIG. 26 is a flow diagram illustrating an embodiment method 800 of making a transistor 300, 400, 500. Referring to step 802, the method 800 includes depositing a first oxide semiconductor layer 106 over a substrate or interconnect level dielectric layer 100. Referring to step 804, the method 800 includes depositing and patterning a photoresist layer 101 over the first oxide semiconductor layer 106 to expose peripheral portions of the oxide semiconductor layer 106. Referring to step 806, the method 800 includes depositing a second oxide semiconductor layer 112 over the exposed peripheral portions of the first oxide semiconductor layer 106 to form source/drain regions, wherein a channel region 106R is located between the source/drain regions Generally, the structures and methods of the present disclosure can be used to form thin-film transistors (TFTs), which may be attractive for BEOL integration since they can be processed at low temperature and can add functionality to the BEOL while freeing up area in the FEOL. Use of TFTs in the BEOL may be used as a scaling path for the 3 nm technology node or beyond by moving peripheral devices such as power gates or I/O devices from the FEOL into higher metal levels of the BEOL. Moving the TFTs from the FEOL to the BEOL may result in about 5-10% area shrink for a given device.

An embodiment is drawn to a transistor 300, 400, 500 including a patterned gate electrode 102; a dielectric layer 104 located over the patterned gate electrode 102; a patterned first oxide semiconductor layer 106 comprising a channel region 106R; and a patterned second oxide semiconductor layer 112 comprising source/drain regions located on either side of the channel region 106R, wherein a thickness of the source/drain regions $t_{S/D}$ is greater than a thickness of the channel region 106R $t_{chan}$.

In one embodiment, a material of the patterned second oxide semiconductor layer 112 is different than the material of the patterned first oxide semiconductor layer 106. In another embodiment, the source/drain regions may be made of the first oxide semiconductor layer 106 and the second oxide semiconductor layer 112. In some embodiments of the invention, the patterned second oxide semiconductor layer 112 contacts the dielectric layer 104. Embodiments of the invention include a dielectric layer 104 that may be formed from one of $SiO_2$, $Al_2O_3$, $HfO_2$, HZO, $HfSiO_x$, $HfLaO_x$, or multilayers thereof. Embodiments of the invention include a patterned first oxide semiconductor layer 106 that may be formed from one of $In_xGa_yZn_zO_w$, $In_2O_3$, $Ga_2O_3$, ZnO, or $In_xSn_yO_z$.

Another embodiment is drawn to a transistor 600 including a patterned first oxide semiconductor layer 106 comprising a channel region 106R; a dielectric layer 104 located over the patterned first oxide semiconductor layer 106; a patterned gate electrode 102 located over the dielectric layer 104; and a patterned second oxide semiconductor layer 112 comprising source/drain regions located on either side of the channel region 106R, wherein a thickness of the source/drain regions $t_{S/D}$ is greater than a thickness of the channel region 106R $t_{chan}$. Embodiments of the invention include a transistor in which a material of the patterned second oxide semiconductor layer 112 is different than the material of the patterned first oxide semiconductor layer 106. Further embodiments of the invention include the source/regions being made of the first oxide semiconductor layer 106 and the second oxide semiconductor layer 112. In some embodiments of the invention, the patterned second oxide semiconductor layer 112 contacts the dielectric layer 104. Embodiments of the invention include a dielectric layer 104 that may be formed from one of $SiO_2$, $Al_2O_3$, $HfO_2$, HZO, $HfSiO_x$, $HfLaO_x$, or multilayers thereof. Embodiments of the invention include a patterned first oxide semiconductor layer that may be formed from one of $In_xGa_yZn_zO_w$, $In_2O_3$, $Ga_2O_3$, ZnO, or $In_xSn_yO_z$. In various embodiments of the invention, a ratio of a thickness of the source/drain regions to the channel region 106R is in a range of 150:2 to 15:8.

Another embodiment is drawn to a method of making a transistor 300, 400, 500, 600 including the operations of depositing a first oxide semiconductor layer 106 over an interconnect level dielectric layer 100. The embodiment method further including the operation of forming a channel region 106R in the first oxide semiconductor layer 106. The embodiment method further including the operation of forming source/drain regions on either side of the channel region 106R, wherein a thickness of the source/drain regions $t_{S/D}$ is greater than a thickness of the channel region 106R $t_{chan}$.

In one embodiment, the method may further include the operation of depositing a second oxide semiconductor layer in the source/drain regions, wherein the second oxide semiconducting layer 112 is a different material than the first oxide semiconducting layer 106. In an embodiment method, the second oxide semiconducting layer 112 is deposited over the first oxide semiconducting layer 106, wherein the source/drain regions comprises the first oxide semiconducting layer 106 and the second oxide semiconducting layer 112. In another embodiment, the method may further include the operations of depositing a metal gate layer 102; and depositing a dielectric layer 104, wherein the dielectric layer 104 comprises one of $SiO_2$, $Al_2O_3$, $HfO_2$, HZO, $HfSiO_x$, $HfLaO_x$, or multilayers thereof and wherein the first oxide semiconductor layer 106 comprises one of $In_xGa_yZn_zO_w$, $In_2O_3$, $Ga_2O_3$, ZnO, or $In_xSn_yO_z$. In an embodiment method, the metal gate layer 102 is deposited beneath the first oxide semiconducting layer 106 and the dielectric layer 104. In another embodiment method, the metal gate layer 102 is deposited over the first oxide semiconducting layer 106 and the dielectric layer 104. In an embodiment method, a ratio of a thickness of the source/drain regions to the channel region 106R is in a range of 150:2 to 15:8.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor, comprising:
a patterned gate electrode;
a dielectric layer located over the patterned gate electrode;
a patterned first oxide semiconductor layer comprising a first oxide semiconductor material composition and including a central portion including a channel region and outer portions on opposing sides of the central portion comprising a lower portion of source/drain regions;
a patterned second oxide semiconductor layer comprising an upper portion of the source/drain regions located on the outer portions of the patterned first oxide semiconductor layer, wherein a thickness of the source/drain regions is greater than a thickness of the channel region, the patterned second oxide semiconductor layer comprises a second oxide semiconductor material composition different than the first oxide semiconductor material composition, and the patterned second oxide semiconductor layer contacts the patterned first oxide semiconductor layer;
an interconnect level dielectric material layer contacting an upper surface of the central portion of the patterned first oxide semiconductor layer at a contact location, wherein the patterned second oxide semiconductor layer is on opposing sides of the interconnect level dielectric material layer at the contact location; and
a pair of metal contacts comprising:
a bottom surface contacting an upper surface of the patterned second oxide semiconductor layer across an entire width of the patterned second oxide semiconductor layer; and
an outer sidewall adjoining the bottom surface and aligned with an outer sidewall of the patterned second oxide semiconductor layer and with a sidewall of the patterned first oxide semiconductor layer, wherein a thickness of the source/drain regions comprises a combined thickness of the patterned second oxide semiconductor layer and the patterned first oxide semiconductor layer, and a ratio of the thickness of the source/drain regions to a thickness of the channel region of the patterned first oxide semiconductor layer is in a range from 150:2 to 15:8, and wherein a sidewall of the patterned gate electrode is under the pair of metal contacts and a bottom surface of the dielectric layer contacts the interconnect level dielectric material layer under the pair of metal contacts.

2. The transistor of claim 1, wherein the dielectric layer comprises one of $SiO_2$, $Al_2O_3$, $HfO_2$, HZO, $HfSiO_x$, $HfLaO_x$, or a multilayer thereof.

3. The transistor of claim 1, wherein the first oxide semiconductor material composition comprises one of $In_xGa_yZnzO_w$, $In_2O_3$, $Ga_2O_3$, ZnO, or $In_xSn_yO_z$.

4. The transistor of claim 1, wherein an upper surface of the pair of metal contacts is coplanar with an upper surface of the interconnect level dielectric material layer.

5. The transistor of claim 1, wherein the interconnect level dielectric material layer comprises a trench and the patterned gate electrode is located in the trench.

6. The transistor of claim 5, wherein the dielectric layer comprises an outer portion located on the interconnect level dielectric material layer outside the trench.

7. The transistor of claim 1, wherein the second oxide semiconductor material composition comprises $In_xGa_yZn_zO_w$.

8. The transistor of claim 1, wherein a thickness of the dielectric layer is in a range from 2 nm to 8 nm, a thickness of the patterned gate electrode is in a range from 2 nm to 16 nm, a thickness of the patterned first oxide semiconductor layer in the channel region is in a range from 2 nm to 8 nm, and the combined thickness of the patterned second oxide semiconductor layer and the patterned first oxide semiconductor layer is in a range from 8 nm to 16 nm.

9. The transistor of claim 1, wherein the pair of metal contacts comprises a first metal contact and a second metal contact, and a length of the patterned gate electrode is greater than a distance between a center of the first metal contact and a center of the second metal contact and less than a distance between the outer sidewall of the first metal contact and the outer sidewall of the second metal contact.

10. The transistor of claim 9, wherein a length of the bottom surface of the dielectric layer contacting the interconnect level dielectric material layer is greater than a thickness of the dielectric layer.

11. The transistor of claim 10, wherein the interconnect level dielectric material layer comprises at least one of undoped silicate glass, a doped silicate glass, organosilicate glass, or a porous dielectric material, the pair of metal contacts further comprises an inner sidewall, and an entirety of the inner sidewall contacts the interconnect level dielectric material layer.

12. A transistor, comprising:

a gate electrode;

a gate dielectric layer on the gate electrode;

a channel region on the gate dielectric layer, comprising a central portion of a first oxide semiconductor layer, wherein the first oxide semiconductor layer comprises a first oxide semiconductor material composition;

source/drain regions on the gate dielectric layer, comprising a pair of outer portions of the first oxide semiconductor layer on opposing sides of the central portion, and a second oxide semiconductor layer on the pair of outer portions of the first oxide semiconductor layer, wherein a thickness of the source/drain regions is greater than a thickness of the channel region, the second oxide semiconductor layer comprises a second oxide semiconductor material composition different than the first oxide semiconductor material composition, and the second oxide semiconductor layer contacts the first oxide semiconductor layer;

an interconnect level dielectric material layer contacting an upper surface of the central portion of the first oxide semiconductor layer at a contact location, wherein the second oxide semiconductor layer is on opposing sides of the interconnect level dielectric material layer at the contact location; and a pair of metal contacts comprising:

a bottom surface contacting an upper surface of the second oxide semiconductor layer across an entire width of the second oxide semiconductor layer; and an outer sidewall adjoining the bottom surface and aligned with an outer sidewall of the second oxide semiconductor layer and with a sidewall of the first oxide semiconductor layer, wherein a thickness of the source/drain regions comprises a combined thickness of the second oxide semiconductor layer and the first oxide semiconductor layer, and a ratio of the thickness of the source/drain regions to a thickness of the channel region of the first oxide semiconductor layer is in a range from 150:2 to 15:8, and wherein a sidewall of the gate electrode is under the pair of metal contacts and a bottom surface of the gate dielectric layer contacts the interconnect level dielectric material layer under the pair of metal contacts.

13. The transistor of claim 12, wherein each of the first oxide semiconductor material composition and the second oxide semiconductor material composition comprises one of $In_xGa_yZn_zO_w$, $In_2O_3$, $Ga_2O_3$, ZnO, or $In_xSn_yO_z$.

14. The transistor of claim 12, wherein a bottom surface of the second oxide semiconductor layer contacts an upper surface of the first oxide semiconductor layer.

15. The transistor of claim 12, wherein a length of the channel region is in a range from 15 nm to 150 nm, a length of the source/drain regions is in a range from 15 nm to 150 nm, and a length of the gate electrode is greater than the length of the channel region, such that the source/drain regions are located over the gate electrode.

16. The transistor of claim 12, wherein the source/drain regions comprise:

a first source/drain region including a first portion of the second oxide semiconductor layer; and a second source/drain region including a second portion of the second oxide semiconductor layer that is separate from the first portion of the second oxide semiconductor layer.

17. A semiconductor device, comprising:

a metal layer;

a dielectric layer on the metal layer;

a first oxide semiconductor layer on the dielectric layer comprising a first oxide semiconductor material composition and including a central portion and a pair of outer portions on opposing sides of the central portion;

an interconnect level dielectric (ILD) layer contacting the central portion of the first oxide semiconductor layer at a contact location;

a pair of second oxide semiconductor layer portions in the ILD layer on the pair of outer portions of the first oxide semiconductor layer, respectively, wherein the pair of second oxide semiconductor layer portions are on opposing sides of the ILD layer at the contact location, the pair of second oxide semiconductor layer portions comprise a second oxide semiconductor material composition different than the first oxide semiconductor material composition, and the pair of second oxide semiconductor layer portions contact the first oxide semiconductor layer; and a pair of metal contacts comprising:

a bottom surface contacting an upper surface of the pair of second oxide semiconductor layer portions across an entire width of the pair of second oxide semiconductor layer portions; and an outer sidewall adjoining the bottom surface and aligned with an outer sidewall of the pair of second oxide semiconductor layer portions and with a sidewall of the first oxide semiconductor layer, wherein a ratio of a combined thickness of the pair of second oxide semiconductor layer portions and the first oxide semiconductor layer to a thickness of the first oxide semiconductor layer is in a range from 150:2 to 15:8, and wherein a sidewall of the metal layer is under the pair of metal contacts and a bottom surface of the dielectric layer contacts the ILD layer under the pair of metal contacts.

18. The semiconductor device of claim 17, wherein the metal layer, the dielectric layer, the first oxide semiconductor layer and the second oxide semiconductor layer are embedded in the ILD layer.

19. The semiconductor device of claim 17, wherein an upper surface of the pair of metal contacts is coplanar with an upper surface of the ILD layer.

20. The semiconductor device of claim 17, wherein the semiconductor device comprises a transistor comprising:

a channel region comprising the central portion of the first oxide semiconductor layer; and an active region contacting the channel region and comprising the pair of outer portions of the first oxide semiconductor layer and the second oxide semiconductor layer.

21. The semiconductor device of claim 20, wherein a thickness of the active region is greater than a thickness of the channel region.

22. The semiconductor device of claim 20, wherein a conductivity of the active region is greater than a conductivity of the channel region.

* * * * *